US006842360B1

(12) United States Patent
Srinivasan

(10) Patent No.: US 6,842,360 B1
(45) Date of Patent: Jan. 11, 2005

(54) HIGH-DENSITY CONTENT ADDRESSABLE MEMORY CELL

(75) Inventor: Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/452,230

(22) Filed: May 30, 2003

(51) Int. Cl.$^7$ .............................................. G11C 15/00
(52) U.S. Cl. ..................... 365/49; 365/189.07; 711/108
(58) Field of Search ............................ 365/49, 189.07, 365/177, 104; 711/108

(56) References Cited

U.S. PATENT DOCUMENTS

| | | |
|---|---|---|
| 3,531,778 A | 9/1970 | Gardner et al. |
| 3,543,296 A | 11/1970 | Gardner et al. |
| 3,609,702 A | 9/1971 | Gardner et al. |
| 3,644,906 A | 2/1972 | Weinberger |
| 3,681,762 A | 8/1972 | Minshull et al. |
| 3,706,977 A | 12/1972 | Dailey et al. |
| 3,708,788 A | 1/1973 | Dailey et al. |
| 3,761,902 A | 9/1973 | Weinberger |
| 3,771,142 A | 11/1973 | Minshull et al. |
| 3,890,603 A | 6/1975 | Jones et al. |
| 3,924,243 A | 12/1975 | Vermeulen |
| 4,942,556 A | 7/1990 | Sasaki et al. |
| 5,319,590 A | 6/1994 | Montoye |
| 5,841,874 A | 11/1998 | Kempke et al. |
| 6,044,005 A | 3/2000 | Gibson et al. |
| 6,137,707 A | 10/2000 | Srinivasan et al. |
| 6,154,384 A | 11/2000 | Nataraj et al. |
| 6,310,880 B1 | 10/2001 | Waller |
| 6,373,739 B1 | 4/2002 | Lien |
| 6,522,562 B2 | 2/2003 | Foss |
| 6,563,727 B1 | 5/2003 | Roth et al. |
| 6,597,594 B2 | 7/2003 | Waller |
| 6,697,275 B1 * | 2/2004 | Sywyk et al. .................. 365/49 |

FOREIGN PATENT DOCUMENTS

| | | |
|---|---|---|
| GB | 1127270 | 9/1968 |
| GB | 1281387 | 7/1972 |

OTHER PUBLICATIONS

Flinders, M. et al., "Functional Memory as a General Purpose Systems Technology," IBM UK Laboratories Ltd., IEEE Compcon, pp. 314–324, Jun. 1970.

Gardner, P.L., "Functional Memory and Its Microprogramming Implications," IEEE Trans. on Computers, vol. C–20, No. 7, pp. 764–775, Jul. 1971.

Kohonen, T., "Content–Addressable Memories," Springer–Verlag Berlin Heidelberg, pp. 173–178, 1980.

* cited by examiner

*Primary Examiner*—David Lam
(74) *Attorney, Agent, or Firm*—Shemwell Gregory & Courtney LLP

(57) ABSTRACT

A content addressable memory (CAM) cell. The CAM cell includes a first and second memory cells and a diffusion region. First and second transistors are formed adjacent one another in the diffusion region and coupled to the first memory cell, and third and fourth transistors are formed adjacent one another in the diffusion region and coupled to the second memory cell.

36 Claims, 12 Drawing Sheets

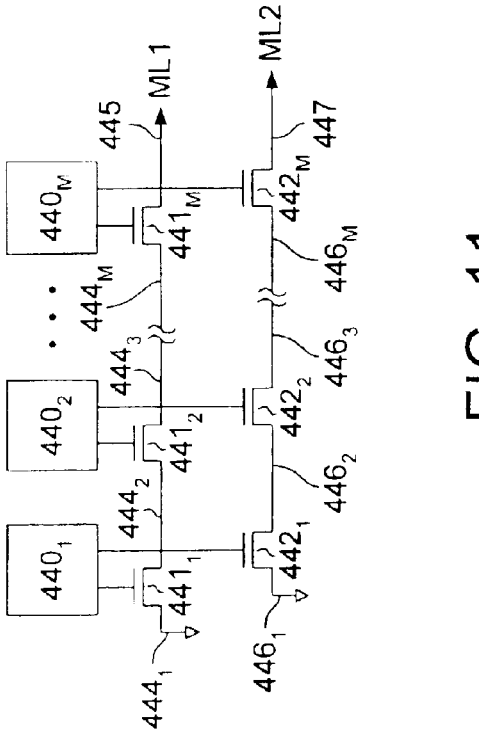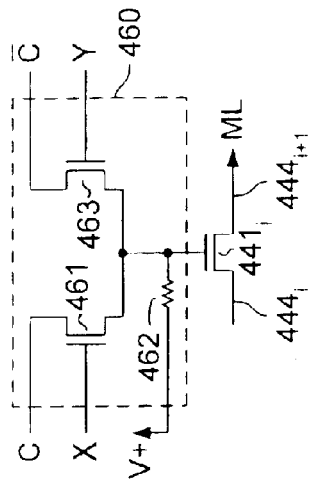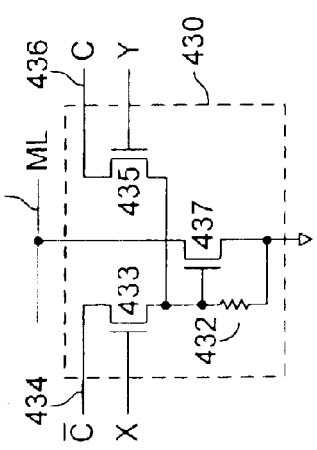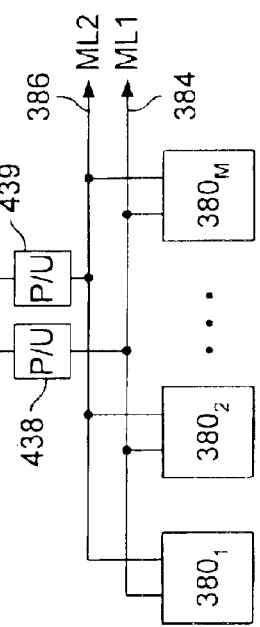

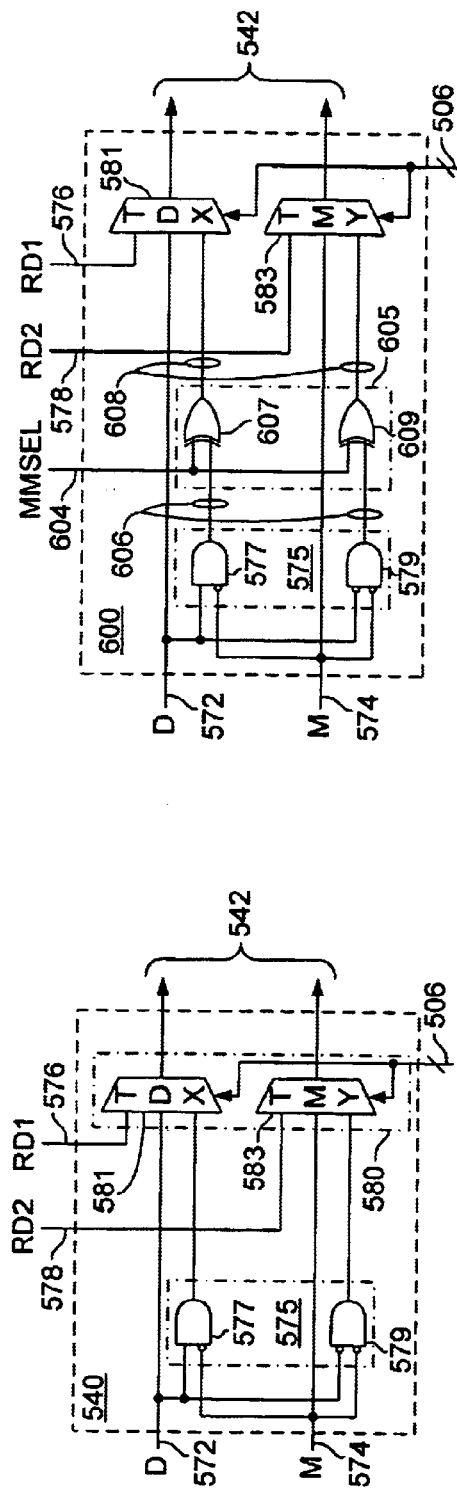
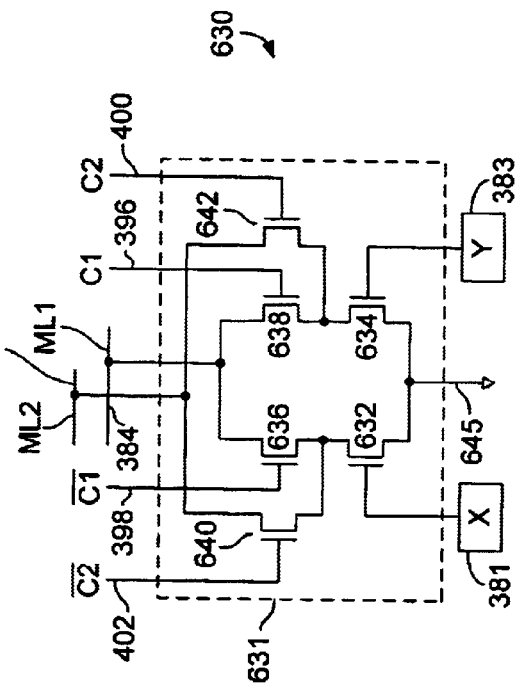
FIG. 15
FIG. 14
FIG. 16

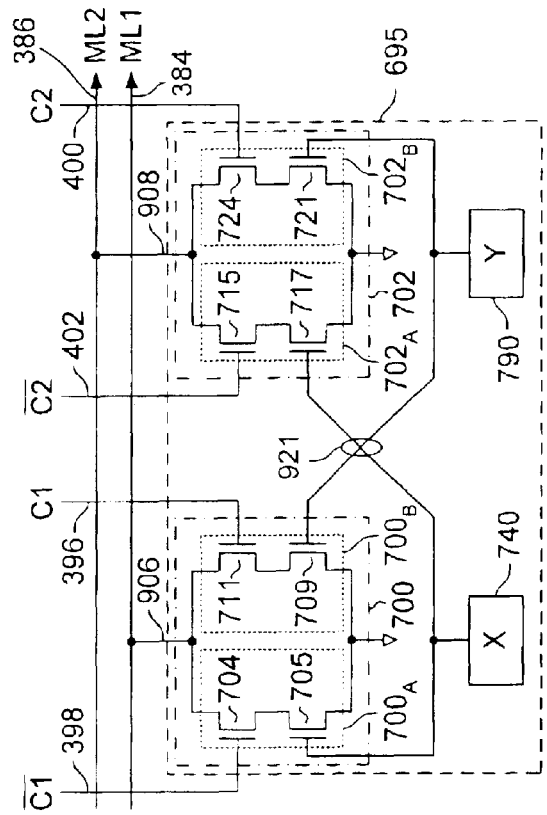
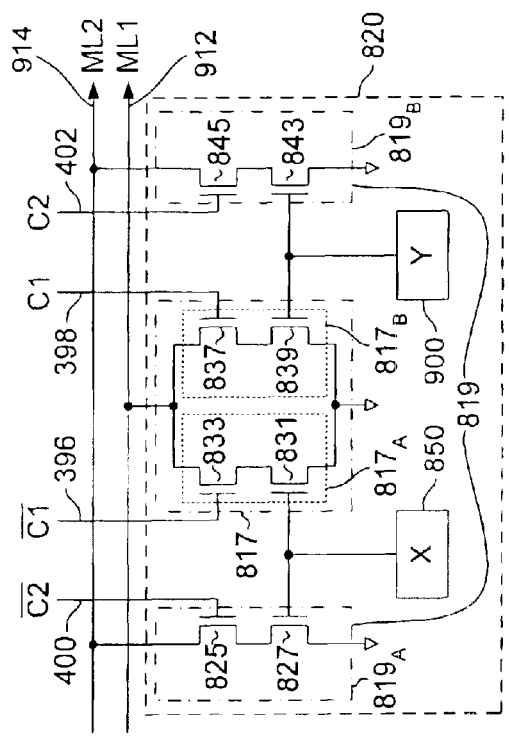
FIG. 19A
FIG. 19B

HIGH-DENSITY CONTENT ADDRESSABLE MEMORY CELL

FIELD OF THE INVENTION

The present invention relates generally to content addressable memory (CAM) devices, and more particularly to a method and apparatus for simultaneously performing a plurality of compare operations in a CAM device.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. The CAM device typically indicates if a match occurs by asserting a match flag, and also typically indicates if multiple matches occur by asserting a multiple match flag. The CAM device can then be instructed to output the highest priority match address or index, data stored in one or more CAM cells at the matching address, and other status information including the match flags, a full flag, validity bits (e.g., skip and empty bits), and other status information.

CAM devices require a particular amount of time to perform a compare operation. This time includes the time to load and decode the compare instruction, the time to provide the comparand data to the CAM array, the time to perform the comparison operation within the CAM array, and the time to determine the highest priority matching location. Compare operations have a direct correlation to search rates for the CAM device. It is generally desirable to increase the search rate of a CAM device so to increase the overall throughput of a system incorporating the CAM device.

Pipelining compare instructions to a particular CAM device has been used to increase the throughput of that CAM device. By pipelining compare instructions, the CAM device can run at its maximum sustained search rate over multiple periods of time. For example, if a CAM device can run at 40 MHz and perform one search per clock cycle (i.e., 40 MS/s or 40 million searches per second), then pipelining of the compare instruction will enable the CAM device to further increase the search rate at the expense of an initial cycle latency.

FIGS. 1 and 2 show another technique for increasing the search rate of a CAM device. In FIG. 1, a single CAM device has been replaced with a CAM system 100 that includes multiple CAM devices 107–110 that can increase the sustained search rate of CAM system 100 to approximately four times over that of a single CAM device (e.g., CAM device 107). For example, as shown in FIG. 2, if CAM device 107 has an individual maximum sustained search rate of 40 MS/s, then system 100 can increase the sustained search rate of system 100 to 160 MS/s. This is accomplished at the expense of adding three redundant CAM devices 108–110 each storing a redundant set of data, and by providing separate comparand data to each CAM device in successive clock cycles. As shown in FIG. 2, CAM device 107 will receive a first compare instruction (CMP1) and first comparand data during a first system clock cycle, CAM device 108 will receive a second compare instruction (CMP2) and second comparand data during a second system clock cycle, CAM device 109 will receive a third compare instruction (CMP3) and third comparand data during a third system clock cycle, and CAM device 110 will receive a fourth compare instruction (CMP4) and fourth comparand data during a fourth system clock cycle. While the system clock runs at 160 MHz, each individual CAM device runs at 40 MHz and typically receives a 40 MHz clock signal in addition to the 160 MHz system clock (or a logical combination of the two clocks).

As each CAM device has an individual search rate of 40 MS/s, each CAM device will output to OBUS 104 the matching address of any matching location in its CAM array approximately five cycles after receiving its compare instruction and comparand data. Thus, after an initial lag period of approximately 25 ns, the sustained search rate will be approximately 160 MS/s starting at cycle T4. This increased sustained search rate, however, is achieved at the expense of adding three redundant CAM device 108–110 and control logic (not shown) necessary to ensure that each CAM device is selected in at the appropriate time to receive the instruction and comparand data. The redundant CAM devices each store a duplicate of the data stored in CAM device 107 which results in increased table management by control logic in which system 100 is incorporated.

It would be advantageous to increase the sustained search rate of a CAM device without significantly increasing the table management tasks of a system, and without adding additional redundant CAM devices.

BRIEF DESCRIPTION OF THE DRAWINGS

The features and advantages of the present invention are illustrated by way of example and are by no means intended to limit the scope of the present invention to the particular embodiments shown, and in which:

FIG. 7 illustrates an exemplary encoding of data and mask bits (D and M) into constituent X and Y bits of a quaternary data value that may be stored in the CAM cell of FIG. 6;

FIG. 8 illustrates an embodiment of a compare circuit that may be used in place of one or both of the compare circuits within the CAM cell of FIG. 6;

FIG. 9 illustrates a row of multi-compare CAM cells coupled to a pair of match lines according to one embodiment;

FIG. 10 illustrates a row of multi-compare CAM cells coupled to a pair of match lines according to another embodiment;

FIG. 11 illustrates an exemplary compare circuit that may be used to implement each of the compare circuits within the CAM cells of FIG. 10;

FIG. 14 illustrates a translation sub-circuit according to one embodiment;

FIG. 15 illustrates a translation sub-circuit according to alternative embodiment;

FIG. 16 illustrates a multi-compare CAM cell according to another embodiment;

FIGS. 19A and 19B illustrate the CAM cells of FIGS. 17 and 18 in schematic form.

DETAILED DESCRIPTION

Figure 1:
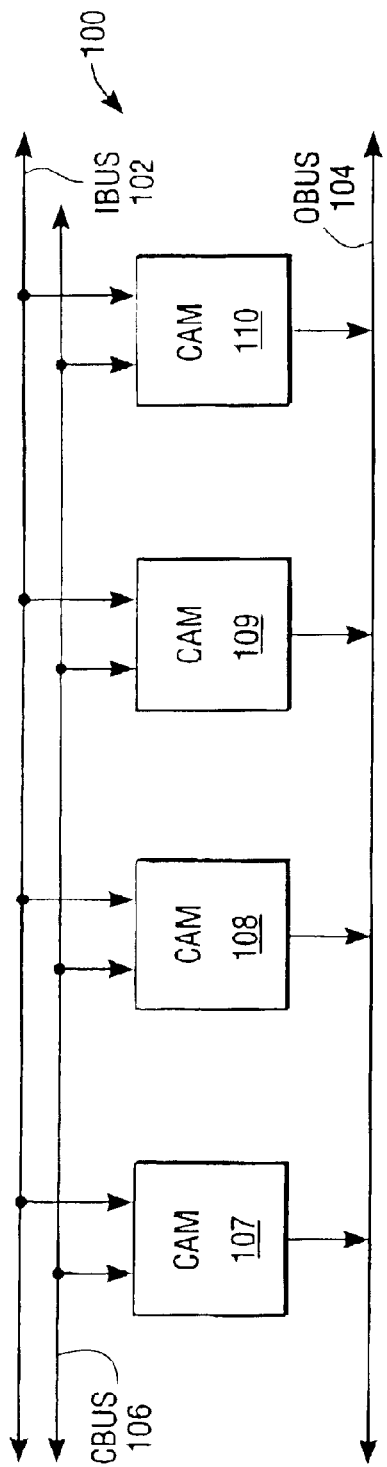
FIG. 1 is a block diagram of a prior CAM system having a plurality of CAM devices each storing the same table.
Figure 2:
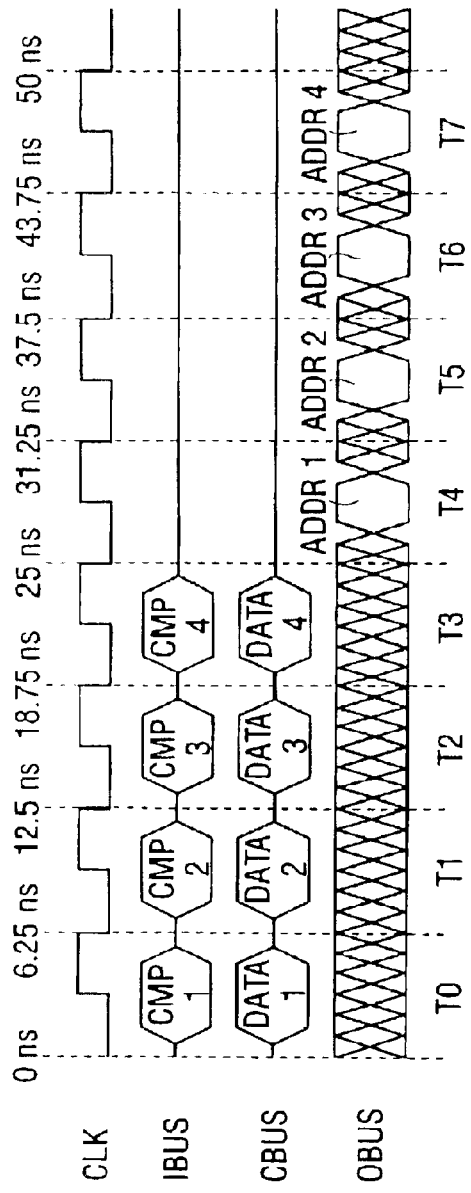
FIG. 2 is timing diagram illustrating the operation of the system of FIG. 1.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signal name>') is also used to indicate an active low signal.

A method and apparatus for simultaneously performing a plurality of compare operations in a content addressable memory (CAM) device is disclosed in various embodiments. In one embodiment, the CAM device includes multiple comparand registers and an array of multi-compare CAM cells. Each of the multi-compare CAM cells includes multiple compare circuits coupled to receive respective comparand data from the multiple comparand registers. In one embodiment, the multiple compare circuits within each of the multi-compare CAM cells are simultaneously enabled to compare respective comparand data with a data value stored within the CAM cell and thereby simultaneously generate multiple comparison results. In an alternative embodiment, the multiple compare circuits are enabled to perform compare operations one after another in pipelined fashion to increase the search rate of the CAM device. In both the simultaneous-compare and pipelined-compare embodiments, a CAM device according to the present invention advantageously enables a single CAM device to have an increased sustained search rate over conventional single CAM devices. This is accomplished without using redundant CAM devices that can cause significant increases in the cost of a system and in overhead due to table management.

In one embodiment, each of the multi-compare CAM cells is a quaternary CAM cell having a pair of memory cells to enable storage of a two-bit data value, referred to herein as quaternary data, representative of one of four logic states for the CAM cell: logic '0', logic '1', forced-match (also referred to as a "don't care" state), and forced-mismatch. One or more of the four logic states may be unused in selected embodiments. By providing quaternary data to each of the multiple compare circuits of a multi-compare CAM cell instead of complementary binary data, comparison results may be masked within each CAM cell (i.e., local masking) without requiring additional transistors or other components in the multiple compare circuits or elsewhere in the CAM cell. Consequently, the quaternary, multi-compare CAM cell may be smaller than a multi-compare CAM cell that includes additional circuit components to achieve local masking. Such size reduction is multiplied by the thousands or millions (or more) of CAM cells included within a given CAM device, substantially reducing the die size of the overall CAM device. The reduced die size potentially enables more of the CAM devices to be fabricated on a given semiconductor wafer, reducing the per-device fabrication cost.

Overview of CAM Device Having Multi-Compare Function

Figure 3:
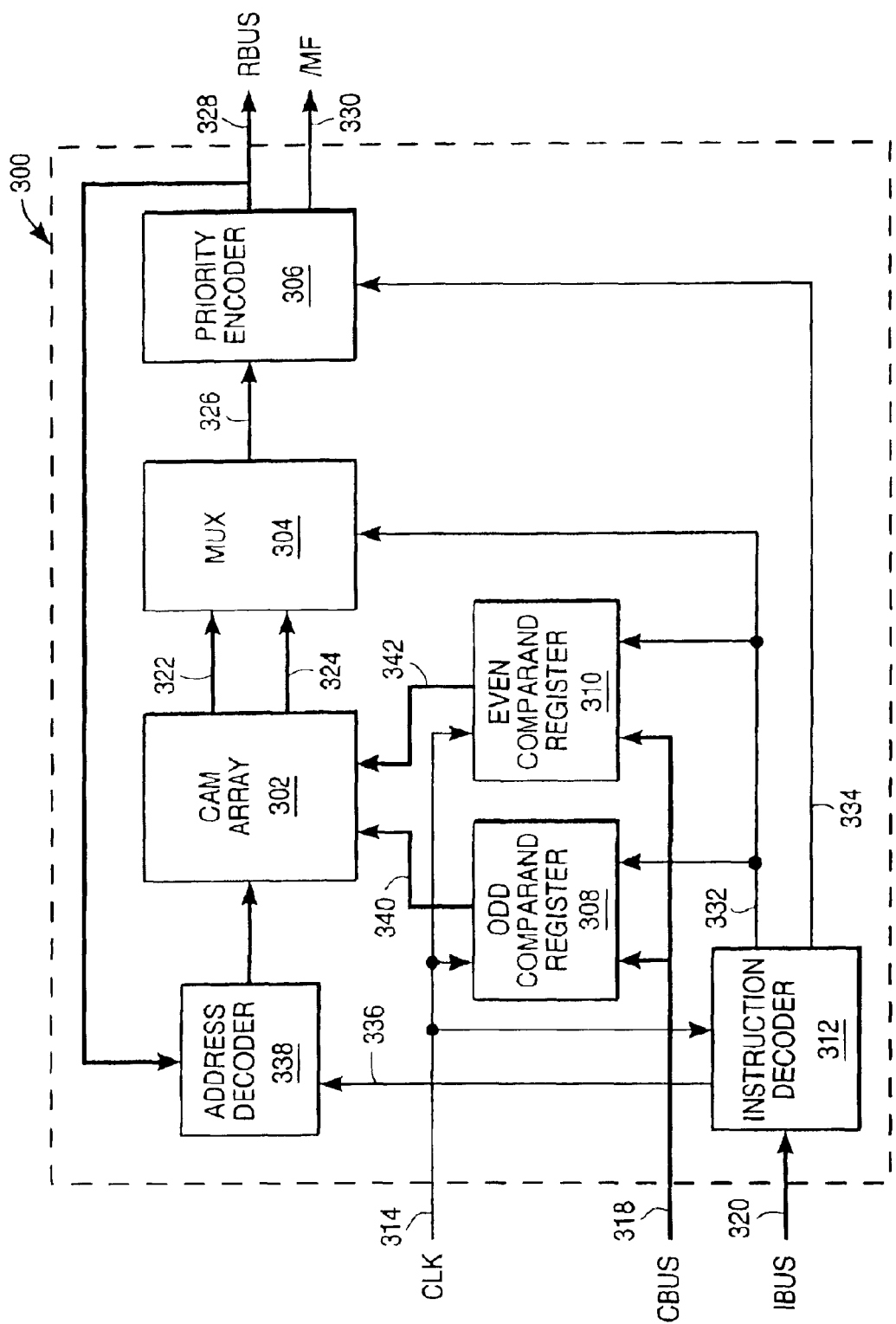
FIG. 3 is a block diagram of one embodiment of a CAM device for simultaneously performing multiple compare operations.

FIG. 3 shows a CAM device 100 that is one embodiment of a CAM device that can perform simultaneous compare operations. CAM device 300 may be a stand-alone CAM device, or may be a CAM device that is incorporated into a larger integrated circuit. CAM device 300 is a synchronous CAM device that performs its operations in response to an external clock signal CLK on line 314. It will be appreciated, however, that alternative embodiments of the present invention may be implemented in asynchronous CAM devices.

CAM device 300 includes an instruction bus IBUS 320 for receiving instructions, a separate comparand bus CBUS 318 for receiving comparand data to be compared with one or more CAM cells of CAM array 302, and a separate output bus RBUS 328 for outputting a matching CAM index or address of CAM array 302. For an alternative embodiment, one or more of buses 318, 320, and 328 may be shared or time multiplexed.

CAM device 300 also includes CAM array 302 that has a plurality of multi-compare CAM cells that store data to be compared with comparand data provided from odd comparand register 308, even comparand register 310, or directly from comparand bus CBUS 318. The comparison results are reflected on even match lines 322 and odd match lines 324 and provided to multiplexer 304. Multiplexer 304 provides either the odd match lines or even match lines to priority encoder 306, and priority encoder 306 outputs a matching address on RBUS 328 and drives match flag /MF on line 330.

Figure 4:
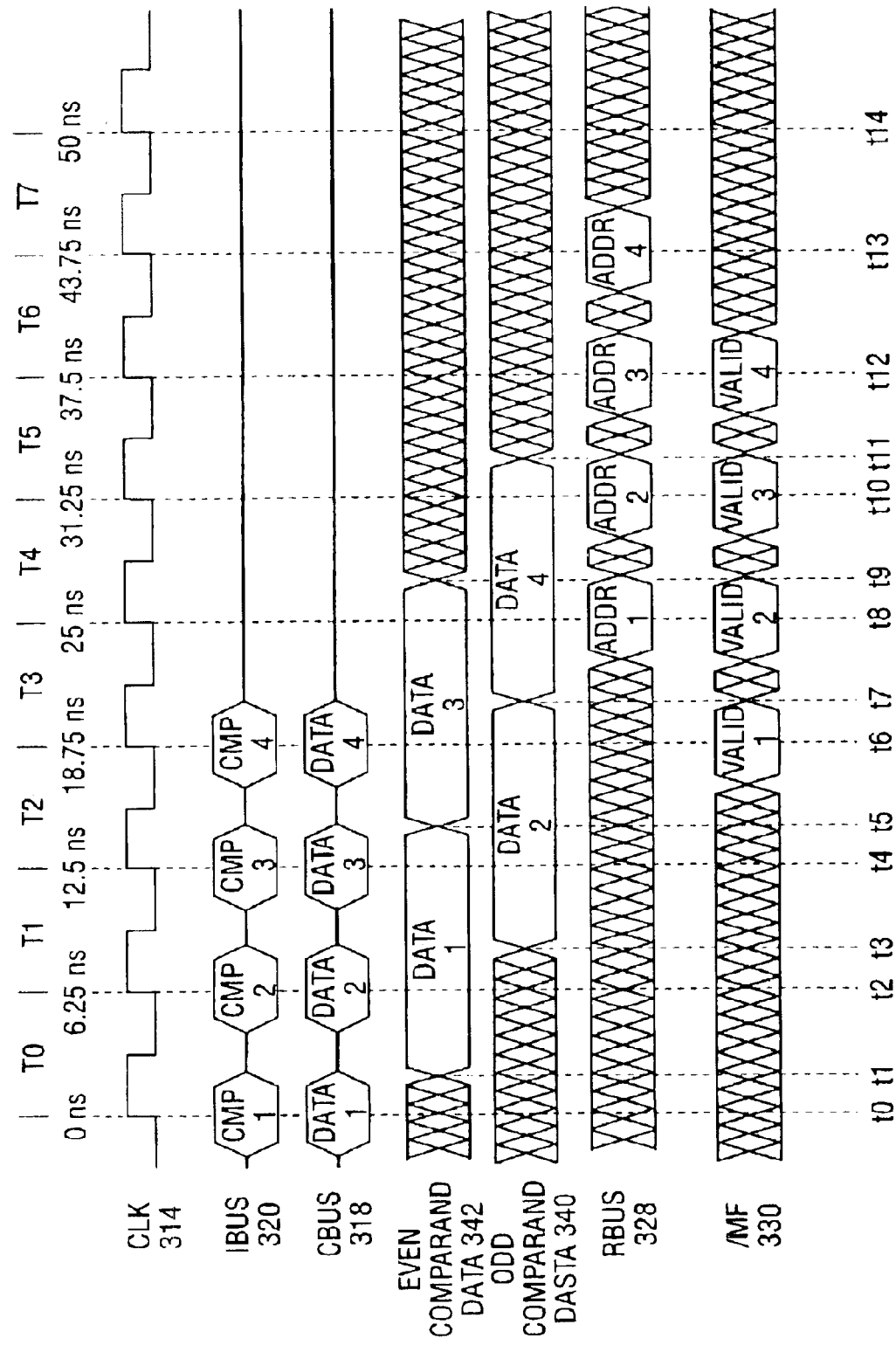
FIG. 4 is a timing diagram illustrating one embodiment of the operation of the CAM device of FIG. 3 simultaneously performing multiple compare operations on the same CAM array.

CAM device 300 can perform multiple interleaved or overlapped compare operations to increase its sustained search rate. For example, as shown in FIG. 4, if CAM device 300 can perform a single compare instruction in approximately 12.5 ns (80 MHz), then CAM device 300 can perform multiple interleaved compare operations to increase the sustained search rate from 80 MS/s to approximately 160 MS/s as follows. At time t0, a first compare instruction (CMP1) is provided to instruction decoder 312 over IBUS 320 together with first comparand data on CBUS 318. Instruction decoder 312 decodes the instruction and causes (e.g., by a signal on line 332) even comparand register 310 to load the first comparand data. Subsequently (e.g., at approximately times t1–t5), even comparand register 310 outputs the first comparand data on bus 342 for comparison with the data stored in CAM array 302. The comparison results are reflected on even match lines 322 and provided to multiplexer 304. Each CAM cell in CAM array 302 is coupled to one of even match lines 322.

At time t2, a second comparison instruction (CMP2) is provided to instruction decoder 312 together with second comparand data on CBUS 318. Instruction decoder 312 decodes the instruction and causes (e.g., by a signal on line 332) odd comparand register 308 to load the second comparand data. Subsequently (e.g., at approximately times t3–t7), odd comparand register 308 outputs the second comparand data on bus 340 for comparison with the data stored in CAM array 302. The comparison results are reflected on odd match lines 324 and provided to multiplexer 304. Each CAM cell in CAM array 302 is coupled to one of odd match lines 324.

As shown in FIG. 4, there is a time (e.g., time t3–t5) in which the first (even) comparand data is provided to CAM array 302 at the same time that the second (odd) comparand data is provided to CAM array 302. During this time, CAM array 302 simultaneously compares the first and second comparand data with its stored data. These comparison results are reflected on even match lines 322 and odd match lines 324.

When the first comparison results are ready, instruction decoder 312 causes multiplexer 304 to select the even match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the first comparand data, and outputs the address of the highest priority matching location to RBUS 328 by time t8. Alternatively, priority encoder 306 may determine any other priority matching address. For another embodiment, the address of the highest priority matching location may be output to RBUS 328 by time t6. Priority encoder 306 may also determine the state of /MF by time t6 (or by a later time) for the first comparison. Alternatively, separate flag logic may make this determination.

The first match address may optionally be fed back to address decoder 338 to locate the address and read data stored in CAM array at the matching address. This data may be output from CAM device 300 together with the first matching address or at any other predetermined time.

When the second comparison results are ready, instruction decoder 312 causes multiplexer 304 to select the odd match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the second comparand data, and outputs the address of the highest priority matching location to RBUS 328 by time t10. Alternatively, priority encoder 306 may determine any other priority matching address. For another embodiment, the address of the highest priority matching location may be output to RBUS 328 by time t8 (when the highest priority matching location of the first compare operation is output by time t6). Priority encoder 306 may also determine the state of /MF for the second comparison by time t8 (or by a later time). Alternatively, separate flag logic may make this determination. The match flag results for the second comparison may be output to the same match flag signal line 330, or they may be output to a second independent signal line.

The second match address may also be optionally fed back to address decoder 338 to locate the address and read data stored in CAM array at the matching address. This data may be output from CAM device 300 together with the second matching address or at any other predetermined time.

Similarly, third and fourth compare operations and their corresponding comparand data can be loaded into CAM device 300 as shown in FIG. 4 such that a new compare operation is loaded every clock cycle, and corresponding matching address or index for that operation is output as valid data after two clock cycles (i.e., in cycles T5 and T6, respectively). As shown in FIG. 4, the third compare operation overlaps the second compare operation, and the fourth compare operation overlaps the third compare operation. While there is an initial time lag of approximately 25 ns to obtain the first search results on RBUS 328, CAM device 300 has a sustained search rate of approximately 160 MS/s over cycles T3–T6.

The internal operation of CAM device 300 and the existence of multiple comparand registers may be transparent to the user of CAM device 300. The user simply knows that CAM device 300 can function with a 160 MHz input clock and provide a sustained search rate of approximately 160 MS/s.

For an alternative embodiment of CAM device 300, multiplexer 300 may be omitted and separate priority encoders may be used to resolve the odd and even match lines. The output of each priority encoder may then multiplexed onto RBUS 328, or may be output to separate RBUSes.

CAM device 300 can be extended to include any number of additional comparand registers and additional sets of match lines to accommodate even higher sustained search rates. For example, CAM device 300 can interleave and simultaneously perform three compare operations when a third comparand register is added, CAM array 302 is modified to include a third match line coupled to each CAM cell, and a third plurality of match lines is provided to multiplexer 304.

Additionally, while the example of FIG. 4 shows specific timing, search rates, and frequencies, it will be appreciated that CAM device 300 can be operated with other timings, search rates and/or frequencies in alternative embodiments.

For another embodiment, two separate CBUSes may be used to provide comparand data to comparand registers 308, and 310. In this embodiment, two comparand data can be simultaneously provided to CAM array 302 for simultaneous comparison with data stored in the array. The simultaneous comparison can be performed completely in parallel in time (vs. interleaved), or may be interleaved. The results of the simultaneous comparison can be simultaneously output via the match lines to multiple RBUSes, or can be time-multiplexed on a single RBUS.

CAM Array Having Multi-Compare CAM Cells

Figure 5:
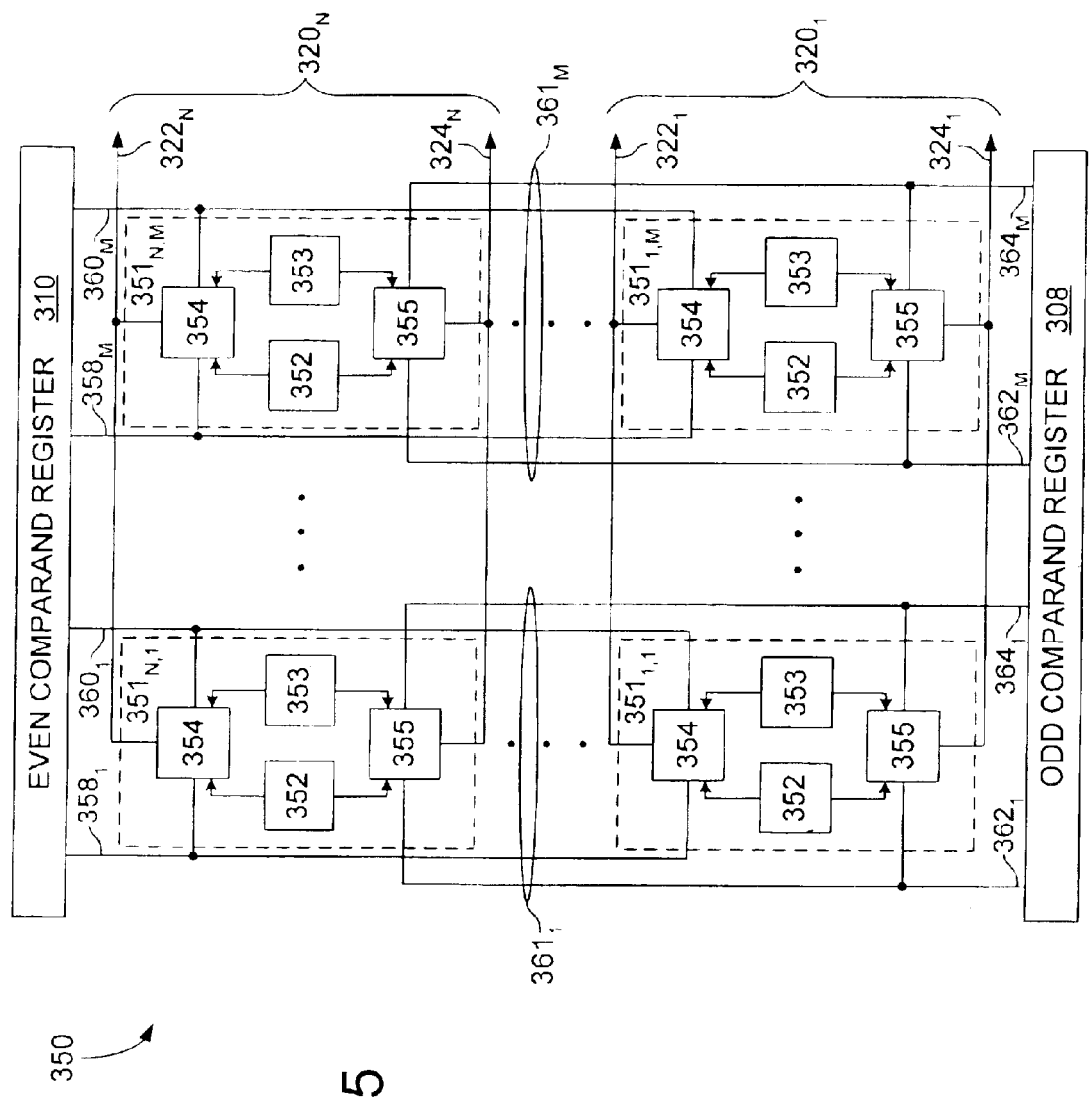
FIG. 5 illustrates one embodiment of a CAM array of the CAM device of FIG. 3.

FIG. 5 illustrates a CAM array 350 that is one embodiment of CAM array 302 of FIG. 3. CAM array 350 includes an array of multi-compare CAM cells 351 arranged in N rows and M columns (N and M being any integer values, including the same value), a set of N match line pairs $320_1$–$320_N$ and a set of M compare line groups $361_1$–$361_M$. The position of each CAM cell 351 within the array 350 is indicated by a row, column subscript. For example, CAM cell $351_{1,1}$ is in the first row of the first column of the CAM array 350. The CAM cells 351 of each row are coupled to a respective match line pair 320, and the CAM cells 351 of each column are coupled to a respective compare line group 361. By this arrangement, each CAM cell 351 within a given column of the CAM array 350 is enabled to receive the same comparand data during a search operation, and each row of CAM cells 351 is enabled to generate a respective pair of match outputs in response to the comparand data.

Each CAM cell 351 includes two memory cells 352 and 353, and two compare circuits 354 and 355, with each of the compare circuits 354, 355 being coupled to receive a data value from each of the memory cells 352, 353. Also, each of the compare circuits 354, 355 is coupled to a respective one of the match lines 322, 324 that form a match line pair 320, and to a respective one of the compare line pairs 358/360, 362/364 that form compare line group 360. Referring to CAM cell $351_{1,1}$, for example, compare circuit 354 is coupled to receive a first data value from memory cell 352 and a second data value from memory cell 353, and is coupled to even match line $322_1$ (one of the two match lines that form match line pair $320_1$) and to even compare line pair $358_1/360_1$ (one of the two compare-line pairs that form compare line group $361_1$). Similarly, compare circuit 355 is coupled to receive the first and second data values from memory cells 352 and 353, respectively, and is coupled to odd match line $324_1$ (the second of the two match lines that form match line pair $320_1$) and to odd compare line pair $362_1/364_1$ (the second of the two compare-line pairs that form compare line group $361_1$). Through this structure, each CAM cell 351 is enabled to simultaneously compare a quaternary data value stored collectively in memory cells 352 and 353 with respective comparand data delivered via the even and odd compare line pairs 358/360 and 362/364 of a compare line group 361, and to apply the corresponding match results to the even and odd match lines 322 and 324 of a match line pair 320. Word lines and data bit lines for conducting data to and from the memory cells 352 and 353 of each CAM cell 351 are also included within the CAM array 350, but are not shown in FIG. 5 to avoid obscuring the structure of the CAM cells 351 and their interconnections to the compare lines and match lines.

In one embodiment, each of the even compare line pairs 358/360 is coupled to an even comparand register 310 and used to conduct a pair of complementary compare signals representative of a respective constituent bit of an even comparand value (i.e., stored in the register 310) to the corresponding column of CAM cells 351. Similarly, each of the odd compare line pairs 362/364 is coupled to an odd comparand register 308 and used to conduct a pair of complementary compare signals representative of a respective constituent bit of an odd comparand value (i.e., stored in the register 308) to the corresponding column of CAM cells 351. In an alternative embodiment, single-ended compare signals may be delivered to the columns of the CAM cells such two compare lines may be used to form a given compare line group 361, rather than the four compare lines per group shown in FIG. 5. Also, in a pipelined system, a single comparand register may be used to drive signals onto the even and odd compare line pairs at different times. In yet other embodiments, the comparand registers may be omitted altogether, with the even and odd compare line pairs being driven directly (and either simultaneously or in time-multiplexed fashion) by comparand data signals received via an external interface. Note that, while the compare signals present on a compare line pair are generally referred to herein as being complementary comparand signals, both compare lines of a compare line pair may be driven to the same state (low or high), for example, to mask compare operations within an entire column of the CAM array 350.

Still referring to FIG. 5, the memory cells 352 and 353 may be any type of volatile or non-volatile memory cell including, without limitation, static random access memory (SRAM) cells formed from back-to-back coupled inverters, negative-differential-resistor (NDR) devices, such as thyristor-based random access memory (T-RAM), or other data latching structures; dynamic random access memory cells (DRAM); programmable read-only memory (PROM) cells such as various types of erasable PROM (e.g., electrically erasable PROM (EEPROM) such as flash EEPROM) and so forth.

Because each CAM cell 351 includes two compare circuits 354, 355 coupled respectively to match lines 322 and 324, each CAM cell 351 is capable of simultaneously performing two comparison operations on the data stored in the memory cells 352 and 353. That is, odd compare circuits 354 can compare the data from odd comparand register 308 with the data in memory cells 352 and 353 at the same time that even compare circuits 355 can compare data from even comparand register 310 with the data in memory cells 352, 353, thereby increasing the overall sustained search rate of the CAM array 350. Each of the compare circuits 354, 355 may be any type of compare circuit that can compare the data value stored in memory cells 352 and 353 with the comparand data delivered via the corresponding compare line pair.

Each CAM cell 351 can be extended to perform as many simultaneous compare operations as are required by a CAM device incorporating CAM array 350 by including additional compare circuits, compare lines, and match lines. For example, three simultaneous compare operations can be performed by adding a third match line coupled to a third compare circuit in each CAM cell 351. As with compare circuits 354 and 355, the third compare circuit is coupled to receive data from each of the memory cells 352 and 353, and may be coupled to receive third comparand data from a third comparand register via a third set of compare lines.

Quaternary Multi-Compare CAM Cell

Figure 6:
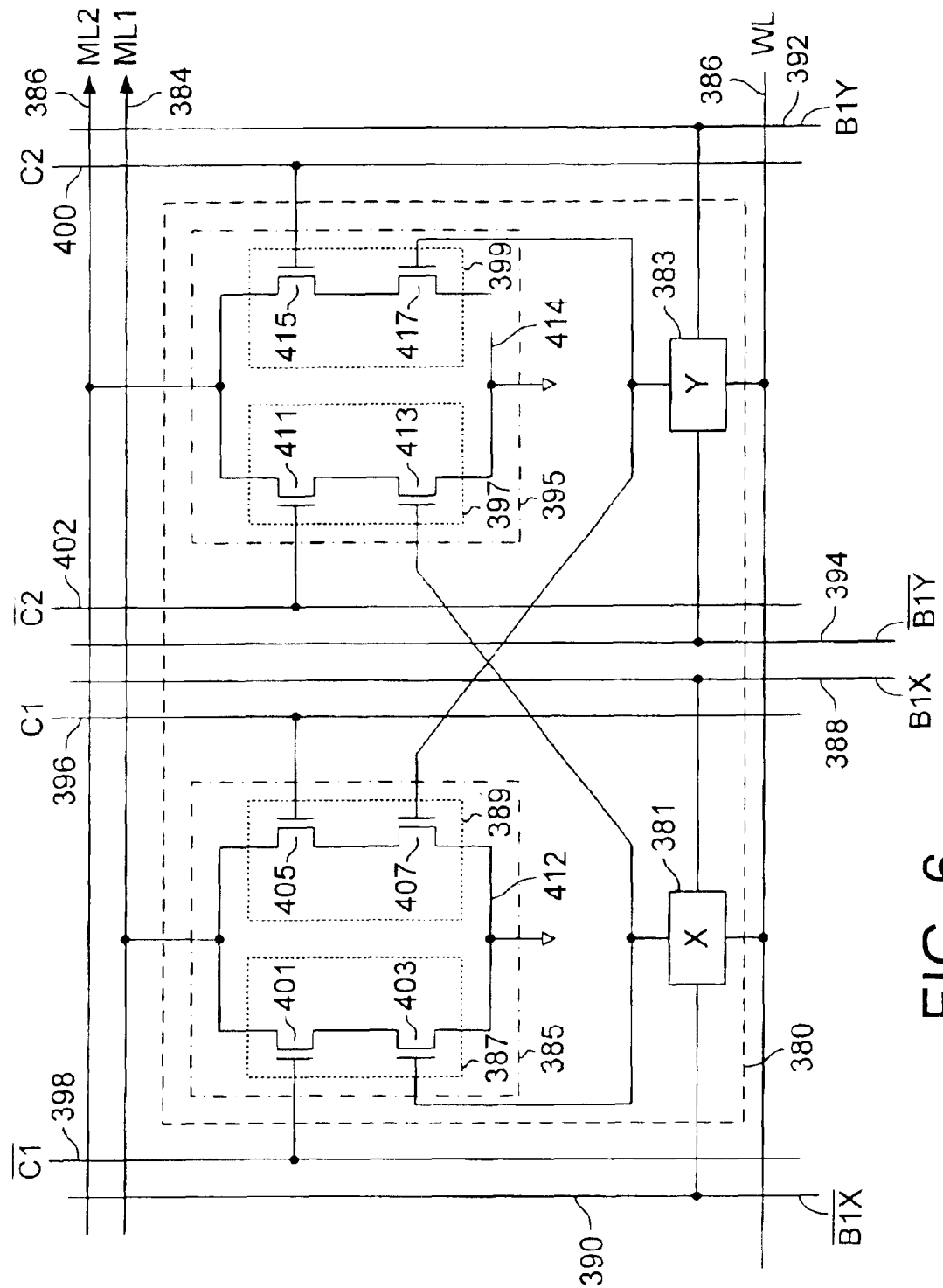
FIG. 6 illustrates one embodiment of a CAM cell of the CAM array of FIG. 5.

FIG. 6 illustrates a multi-compare CAM cell 380 that is one embodiment of the CAM cell 351 of FIG. 5. The CAM cell 380 includes a pair of memory cells 381 and 383 to store the constituent bits, X and Y, respectively, of a quaternary data value, and which are referred to herein as the X-cell 381 and the Y-cell 383. A word line 386 (WL) is coupled to the X-cell 381 and Y-cell 383 and, when activated, enables read/write access to the X- and Y-cells through respective bit line pairs 388/390 and 392/394 (referred to herein as the X-bit lines and Y-bit lines, respectively). A pair of match lines 384 and 386 are coupled to the CAM cell 380 and used to signal the results of compare operations within the CAM cell. In the embodiment of FIG. 6, each of the match lines 384 and 386 is initially precharged to a logic high level (e.g., via precharge or pull-up circuits, not shown), and is then discharged by the CAM cell 380 (i.e., pulled down to a logic low level) to signal a mismatch. If no mismatch is detected by CAM cell 380 (or other CAM cells 380 coupled to the match line), the match line (384 or 386) remains at the logic high level to signal a match. Other match line configurations and match signal states may be used in alternative embodiments, as discussed below.

CAM cell 380 also includes two compare circuits 385 and 395 each coupled to receive the quaternary data value stored in the memory cells 381 and 383, and each coupled to a respective one of match lines 384 (ML1) and 386 (ML2). The compare circuits 385 and 395 are additionally coupled to respective compare line pairs 396/398 and 400/402 to receive respective complementary pairs of comparand signals (i.e., C1 and /C1, and C2 and /C2). By this arrangement, the CAM cell 380 is able to perform simultaneous or pipelined compare operations in the two compare circuits and therefore constitutes a dual-compare CAM cell. Additional compare circuits (coupled to additional match lines and compare line pairs) may be provided in alternative embodiments of the CAM cell 380 to enable more than two simultaneous comparisons or more than two pipelined compare operations.

Still referring to FIG. 6, compare circuit 385 includes a pair of compare sub-circuits 387/389 coupled in parallel with one another between reference node 412 (a ground node in this example, though other reference voltages may be used) and match line 384 (ML1), and compare circuit similarly includes a pair of compare sub-circuits 397/399 coupled in parallel with one another between reference voltage node 414 and match line 386 (ML2). Referring specifically to compare circuit 385, sub-circuit 387 includes transistors 401 and 403 coupled in series between match line 384 and reference node 412, and sub-circuit 389 includes transistors 405 and 407 also coupled in series between match line 384 and reference node 412. In compare circuit 395, sub-circuit 397 includes transistors 411 and 413 coupled in series between match line 386 and reference node 414, and sub-circuit 399 includes transistors 415 and 417 also coupled in series between match line 386 and the reference node 414. Control terminals of transistors 403 and 413 (i.e., MOS transistor gates in this example) are coupled to X-cell 381 and therefore are switched on or off according to the state of the X-bit of a quaternary data value, and control terminals of transistors 407 and 417 are coupled to Y-cell 383 and are therefore switched on or off according to the state of the Y-bit of the quaternary data value. Transistors 405 and 401 are coupled to compare lines 396 and 398, respectively and are therefore switched on or off according to the state of comparand signals C1 and /C1 presented on the compare line pair 396/398. Transistors 415 and 411 are similarly coupled to compare lines 400 and 402, respectively, and are therefore switched on or off according to the state of comparand signals C2 and /C2 presented on the compare line pair 400/402. Thus, match line 384 is switchably coupled to reference node 412 via transistor pair 401/403 of compare sub-circuit circuit 387, and via transistor pair 405/407 of compare sub-circuit 389. Similarly, match line 386 is switchably coupled to reference node 414 via transistor pair 411/413 of compare sub-circuit 399 and via transistor pair 415/417 of compare sub-circuit 399.

FIG. 7 illustrates an exemplary encoding of data and mask bits (D and M) into constituent X and Y bits of a quaternary data value that may be stored in the X- and Y-cells 381, 383 of FIG. 6. In traditional ternary CAM devices, data bits and mask bits are stored within each CAM cell. Data bits are compared with incoming comparand data, and mask bits, when set to a mask state, are used to prevent mismatch conditions (i.e., mismatch between data bit and comparand signal) from being signaled on a match line. In the encoding of FIG. 7, when the mask bit, M, is a logic '0' (i.e., a non-masking state), the X bit has the same state as the data bit, D, and the Y bit is the complement of the X bit. That is, if M=0, then X=D and Y=/X=/D. By contrast, if the mask bit is a logic '1', indicating that any mismatch detected within the CAM cell is to be masked, then both the X and Y bits are set to zero, regardless of the state of the data bit. For the encoding of FIG. 7, the quaternary data value is said to be in a logic '0' state when XY=01 (i.e., X=D=0 and Y=/D=1); a logic '1' state when XY=10 (i.e., X=D=1, Y=/D=0); and a forced-match state when XY=00 (i.e., M=1 and D=0 or 1). This encoding simplifies to the Boolean expressions: X=D*/M and Y=/D*/M, where the '*' symbol denotes a logic AND function. Note that a forced-mismatch state (XY=11) may also be stored in the CAM cell 380 to force a mismatch indication. Forced-mismatch operation and storage of the forced-mismatch state is discussed below.

Referring again to FIG. 6, and to compare circuit 385 in particular, it can be seen that if the quaternary data value stored in the X- and Y-cells is in a logic '0' or logic '1' state (i.e., XY=01 or XY=10), and the comparand value, C1, is in the opposite state, then one or the other of sub-circuits 387 and 389 will establish a path between match line 384 and reference node 412 to signal the mismatch condition. For example, if the quaternary data value is a logic '0' (XY=01) and C1 is a logic '1', then transistor 407 will be switched on (i.e., switched to a current conducting state) by the '1' stored in Y-cell 383, and transistor 405 will be switched on by the high state of C1, thereby establishing a path between match line 384 and reference node 412 to signal the mismatch condition. Conversely, if the quaternary data value is a logic '1' (XY=10), and C1 is a logic '0', then transistor 403 will be switched on by the '1' stored in the X-cell 381, and transistor 401 will be switched on by the high state of /C1, thereby establishing a path between match line 384 and reference node 412 to signal the mismatch condition.

If the quaternary data value has the same state as C1, then at least one transistor in each of the sub-circuits 387 and 389 will be switched off(i.e., switched to a substantially non-conducting state). That is, if the quaternary data value matches the comparand value, neither of the sub-circuits 387 and 389 will establish a path between the match line 384 and reference node 412, in effect, signaling a match condition. Similarly, if the quaternary data value is in the forced-match state (XY=00), both of the sub-circuits 387 and 389 are switched to a non-conducting state (i.e., because transistors 403 and 407 are switched off) regardless of the state of C1, preventing either of the sub-circuits 387 and 389 from establishing a path between the match line 384 and reference node 412 and thereby forcing the compare circuit 385 to signal a match condition. If the quaternary data value is in a forced-mismatch state (XY=11), then at least one of the sub-circuits 387 and 389 is ensured to be switched to a conducting state in response to a differential comparand signal on compare lines 396 and 398, thereby forcing the compare circuit 385 to signal a mismatch condition regardless of the state of C1. As discussed below, the forced-mismatch data state may be used for any number of purposes (e.g., testing the CAM array and match detection logic, selectively invalidating rows of the CAM array, etc.).

In the case of compare circuit 395, if the comparand value, C2, is in the opposite state of the quaternary data value stored in the X- and Y-cells 381, 383, then one or the other of sub-circuits 397 and 399 will establish a path between match line 386 and reference node 414 (ground in this example) to signal the mismatch condition. For example, if the quaternary data value is a logic '0' and C2 is a logic '1', then transistor 417 will be switched on by the '1' stored in Y-cell 383, and transistor 415 will be switched on by the high state of C2, thereby establishing a path between match line 386 and reference node 414 to signal the mismatch condition. Conversely, if the quaternary data value is a logic '1', and C2 is a logic '0', then transistor 413 will be switched on by the '1' stored in the X-cell 381, and transistor 411 will be switched on by the high state of /C2, thereby establishing a path between match line 386 and reference node 414 to signal the mismatch condition.

If the quaternary data value has the same state as C2, then at least one transistor in each of the sub-circuits 397 and 399 will be switched off in response to a logic low input, thereby preventing both of the sub-circuits 397 and 399 from establishing a path between the match line 386 and reference node 414 and, in effect, signaling a match condition. Similarly, if the quaternary data value is in the forced-match state (XY=00), both of the sub-circuits 397 and 399 are switched to a non-conducting state (i.e., because transistors 413 and 417 are switched off) regardless of the state of C2, preventing both of the sub-circuits 397 and 399 from establishing a path between the match line 386 and reference node 414 and thereby forcing the compare circuit 395 to signal a match condition. If the quaternary data value is in a forced-mismatch state (XY=11), then at least one of the sub-circuits 397 and 399 is ensured to be switched to a conducting state in response to a differential comparand signal on compare lines 400 and 402, thereby forcing the compare circuit 395 to signal a mismatch condition regardless of the state of C2.

Reflecting on the CAM cell 380 of FIG. 6, it can be seen that encoding mask and data bits into the X and Y bits of a quaternary data value enables ternary operation of the compare circuits 385 and 395 (i.e., ability to force a match state) without requiring additional transistors or other components within the CAM cell. For example, the additional transistor or transistors typically coupled between match line and compare circuit (or between compare circuit and ground, or between memory cell and compare circuit, or between the comparand and compare circuit) and controlled by a mask cell to provide ternary operation, is omitted in the CAM cell 380, thereby reducing the overall component count for the CAM cell 380 and enabling a correspondingly reduced cell size.

FIG. 8 illustrates an embodiment of a compare circuit 430 that may be used in place of one or both of the compare circuits 385 and 395 within the CAM cell of FIG. 6. The compare circuit 430 includes three transistors 433, 435 and 437, with transistor 437 being coupled between a match line 431 (ML) and a reference voltage (ground in this example) and having a gate terminal coupled to source terminals of transistors 433 and 435. Drain terminals of transistors 433 and 435 are coupled to compare lines 434 and 436, respectively, and gate terminals of transistors 433 and 435 are coupled to receive the X bit and Y bit, respectively, of a quaternary data value. If the quaternary data value, XY, does not match a differential comparand value, C and /C, presented on compare lines 436 and 434, then either X=1 and /C=1, or Y=1 and C=1. In the first mismatch case (X=1, /C=1), transistor 433 is switched on by the high X bit so that the high state of the complement comparand signal, /C, propagates to the gate of transistor 437, switching transistor 437 on and thereby establishing a path between the match line 431 and ground to signal the mismatch. In the second mismatch case (Y=1, C=1), transistor 435 is switched on by the high Y bit so that the high state of the comparand signal, C, propagates to the gate of transistor 437, switching transistor 437 on to signal the mismatch condition. If the quaternary data value does not match the differential comparand value, then a logic low signal is applied to the drain terminal of whichever of transistors 433 and 435 is switched on by the quaternary data value. Consequently, the transistor 437 will not be switched on to establish a path between match line 431 and ground, (i.e., the compare circuit 430 will effectively signal a match condition). Note that, in an alternative embodiment, the data and comparand inputs may be swapped by applying the X and Y bits of the quaternary data value to the drain nodes of the transistors 433 and 435, and applying the complementary comparand signals to the gate nodes of the transistors 433 and 435.

Still referring to FIG. 8, when the quaternary data value is in the forced-match state (XY=00), both transistors 433 and 435 are switched off, isolating the gate of transistor 437. Consequently, transistor 437 will not be switched on and therefore will not establish a path between match line 431 and ground. Thus, when the quaternary data value is in the forced-match state, a match condition is indicated by the compare circuit 430, regardless of the state of the comparand data. Conversely, when the quaternary data value is in the forced-mismatch state (XY=11), both transistors 433 and 435 are switched on, thereby ensuring that transistor 437 will be switched on to establish a path between match line 431 and ground (signaling a mismatch) for any complementary pair of signals on compare lines 434 and 436. Note that a resistive element 432, such as a bleed resistor or similar structure, may be coupled between the gate of transistor 437 and ground to prevent the gate of transistor 437 from floating when transistors 433 and 435 are switched off.

Match Line Arrangements for Rows of Multi-Compare CAM Cells

In one embodiment, illustrated in FIG. 9, match lines 384 and 386 (ML1 and ML2) are each coupled to a row of multi-compare CAM cells $380_1$–$380_M$ and are pulled up to a supply voltage or other reference voltage through respective pull-up circuits 438 and 439. Accordingly, if any one of the ML1-connected compare circuits within the row of CAM cells $380_1$–$380_M$ detects a mismatch or receives a forced-mismatch quaternary data value, the compare circuit will pull match line 384 low to signal the mismatch condition. Similarly, if any one of the ML2-connected compare circuits within the row of CAM cells $380_1$–$380_M$ detects a mismatch or receives a forced-mismatch quaternary data value, the compare circuit will pull match line 386 low to signal the mismatch condition. If no mismatch is signaled by the compare circuits coupled to a given match line 384 or 386 (i.e., either because the comparand data supplied to a given CAM cell matches the quaternary data value stored within the CAM cell 380, or the quaternary data value stored within the CAM cell 380 is set to a forced-match state), then the match line remains pulled up to signal the match condition.

FIG. 10 illustrates a match line arrangement according to an alternative embodiment. Each of the match lines ML1 and ML2 is formed by a respective set of match line segments $444_1$–$444_M$ and $446_1$–$446_M$ coupled to one another via a corresponding set of switching transistors $441_1$–$441_M$ and $442_1$–$442_M$ to form a switchably controlled path between the match line output 445 and 447 and a reference voltage node (ground in this example). Referring to ML1, for example, if all the switching transistors $441_1$–$441_M$ are switched on, a path is completed between the ML1 output 445 and ground to signal a match condition. If one or more of the switching transistors $441_1$–$441_M$ are switched off, the path to ground is interrupted to signal a mismatch condition (e.g., the match line output being pulled up to a reference voltage by a precharge circuit). Similarly, if all the switching transistors $442_1$–$442_M$ of ML2 are switched on, a path is completed between the ML2 output 447 and ground to signal a match condition. If one or more of the switching transistors $4421$–$442_M$ are switched off, the path to ground is interrupted to signal a mismatch condition. If necessary for the logic circuits receiving the match line outputs 445 and 447 (e.g., multiplexer 304 of FIG. 3 or, if the multiplexer is omitted, one or more priority encoders such as priority encoder 306 of FIG. 3), the match line outputs 445 and 447 may be pulled up via pull-up circuits (not shown).

In the embodiment of FIG. 10, negative-type MOS (NMOS) transistors are used to interconnect match line segments $444_1$–$444_M$ and $446_1$–$446_M$, and the CAM cells $440_1$–$440_M$ each generate logic high outputs to signal a match condition. In one embodiment, the CAM cell 380 of FIG. 6 is modified to achieve this result by complementing the state of the comparand signals driven on compare line pairs 396/398 and 400/402 (e.g., C1 is input to transistor 401, /C1 is input to transistor 405, C2 is input to transistor 411 and /C2 is input to transistor 415), and by coupling the reference voltage nodes 412 and 414 to a supply voltage (or other high logic voltage node) instead of ground. Alternatively, rather than complementing the states of the comparand signals driven on the compare line pairs 396/398 and 400/402, the states of the X and Y bits stored within the memory cells 381 and 383 may be complemented, at least for the logic '1' and logic '0' states (in effect, swapping the X and Y memory cells 381 and 383). In yet another embodiment, positive-type MOS (PMOS) transistors may be used in place of the NMOS transistors 441 and 442 depicted in FIG. 10. In such an embodiment, the PMOS transistors are switched on in response to logic low match indications so that the reference voltage nodes 412 and 414 within the CAM cell 380 of FIG. 6 may remain coupled to ground, and either the comparand signals, or the constituent bits of the quaternary data value may be complemented to generate logic low match indications.

FIG. 11 illustrates an exemplary two-transistor compare circuit 460 that may be used to implement each of the multiple compare circuits within each of the CAM cells $440_1$–$440_M$ of FIG. 10. The compare circuit 460 is similar in structure and operation to the compare circuit 430 of FIG. 8, except that the transistor 437 coupled between match line 431 and ground is omitted, in effect, being replaced by a transistor $441_i$ coupled between a pair of match line segments $444_i$ and $444_{i+1}$ ('i' being an integer between 1 and M), and the position of the quaternary data inputs, X and Y, are reversed relative to the complementary comparand signal inputs, C and /C (i.e., X and C are applied to the gate and drain of transistor 461 (or vice-versa) and Y and /C are applied to the gate and drain of transistor 463). Thus, if the quaternary data value matches the comparand value, C, then either C and X will be high or /C and Y will be high, both cases resulting in a logic high signal being applied to the gate of transistor $441_i$, switching transistor $441_i$ on to establish continuity between the match line segments $444_i$ and $444_{i+1}$. A resistive element 462, such as a bleed resistor or similar structure, may be coupled between the output node of the compare circuit 460 (i.e., and therefore to the source terminals of transistors 461 and 463) and a logic high voltage node (V+) to pull up the gate of transistor $441_i$ when transistors 461 and 463 are switched off, thereby maintaining transistor $441_i$ in a conducting state to signal a match. In an alternative embodiment, a pair of PMOS transistors are coupled in series between the gate of transistor $441_i$ and a logic high voltage node, the PMOS transistors being switched on in response to logic low X and Y inputs, respectively, to establish a path between the logic high voltage node and the gate of transistor $441_i$ when transistors 461 and 463 are switched off.

CAM Device with Data/Mask-to-Quaternary Translator

Figure 12:
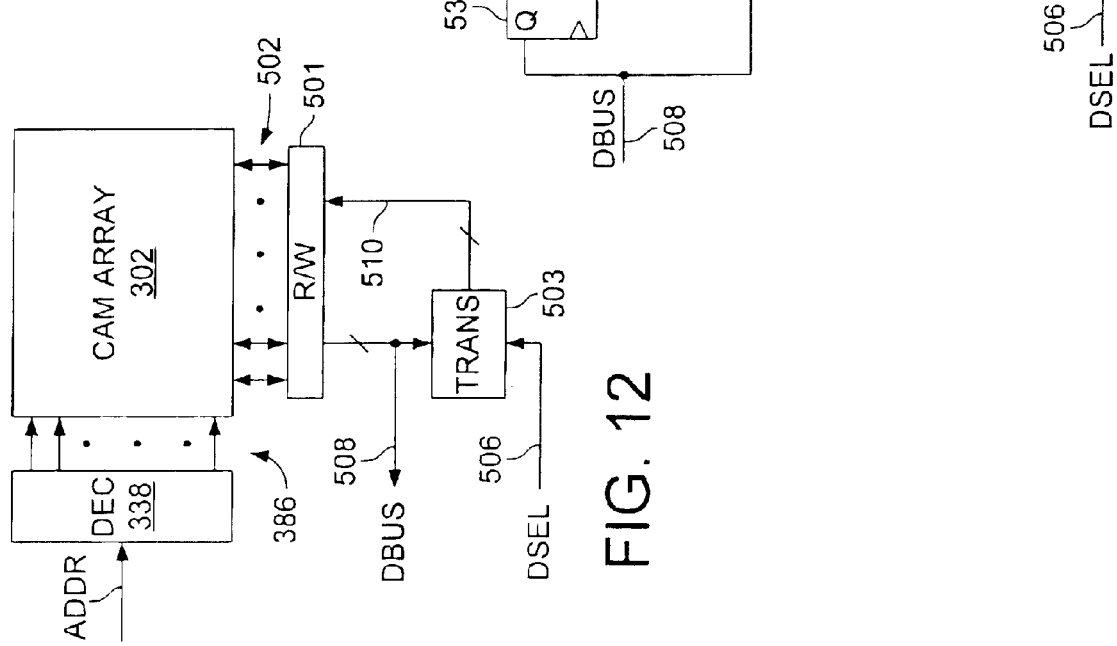
FIG. 12 illustrates an embodiment of a circuit for reading and writing data in an array of multi-compare, quaternary CAM cells.

FIG. 12 illustrates a circuit arrangement for reading and writing data in an array 302 of multi-compare quaternary CAM cells. An address decoder 338 activates one of a plurality of word lines indicated by an address value (ADDR) to enable read and write access to a selected row of CAM cells within the array 302 (i.e., the row of CAM cells selected by the address value). In a read operation, read circuitry within a read/write circuit 501 senses a data word output onto bit lines 502 from the selected row of CAM cells and outputs the data word, referred to herein as read data word, onto a data bus 508. The data bus 508 may be a dedicated to providing read and write access to the CAM array 302, or may be time multiplexed with comparand data, result data and/or instruction data (e.g., the data bus 508 may be the CBUS 318, RBUS 328 or IBUS 320 of FIG. 3). In a write operation, a write data word is received via the data bus 508 and input to a data word translator 503. In one embodiment, the data word translator 503 generates a translated data word (also referred to herein as an encoded data word) based on data and mask bits within the incoming write data word, then selects, according to the state of a data select signal 506 (DSEL), either the translated data word or the write data word to be output to the read/write circuit 501 via write data path 510. Write driver circuits within the read/write circuit 501 drives the selected data word (i.e., the data word output from the data word translator 503) onto the bit lines 502 of the CAM array 302 for storage in an address-selected row of CAM cells. In an alternative embodiment, the data word translator 503 additionally receives a read data word from the read/write circuit 501 (e.g., via path 508) to enable a data word read from a source row of CAM cells within the CAM array 302 to be transferred to a destination row of CAM cells. In a first type of transfer operation, referred to herein as a copy operation, the content of the source row (i.e., the row of CAM cells which from which a read data word is read) is unaffected by the storage of the read data word in the destination row. In a second type of transfer operation, referred to herein as a move operation, the content of the source row is invalidated (e.g., by flipping one or more bits indicative of row validity, or by storing a predetermined value within the row) as part of the transfer operation. The source row may be invalidated during the data read operation (e.g., by driving bit lines coupled to a column of validity CAM cells to store an invalid state for the source row); after the data read operation, but prior to or during data word storage in the destination row; or after the data word is stored in the destination row. In another alternative embodiment, the data word translator 503 and data word selector may be omitted altogether, with any desired data word translation being performed by the write requestor or other external circuitry.

Figure 13:
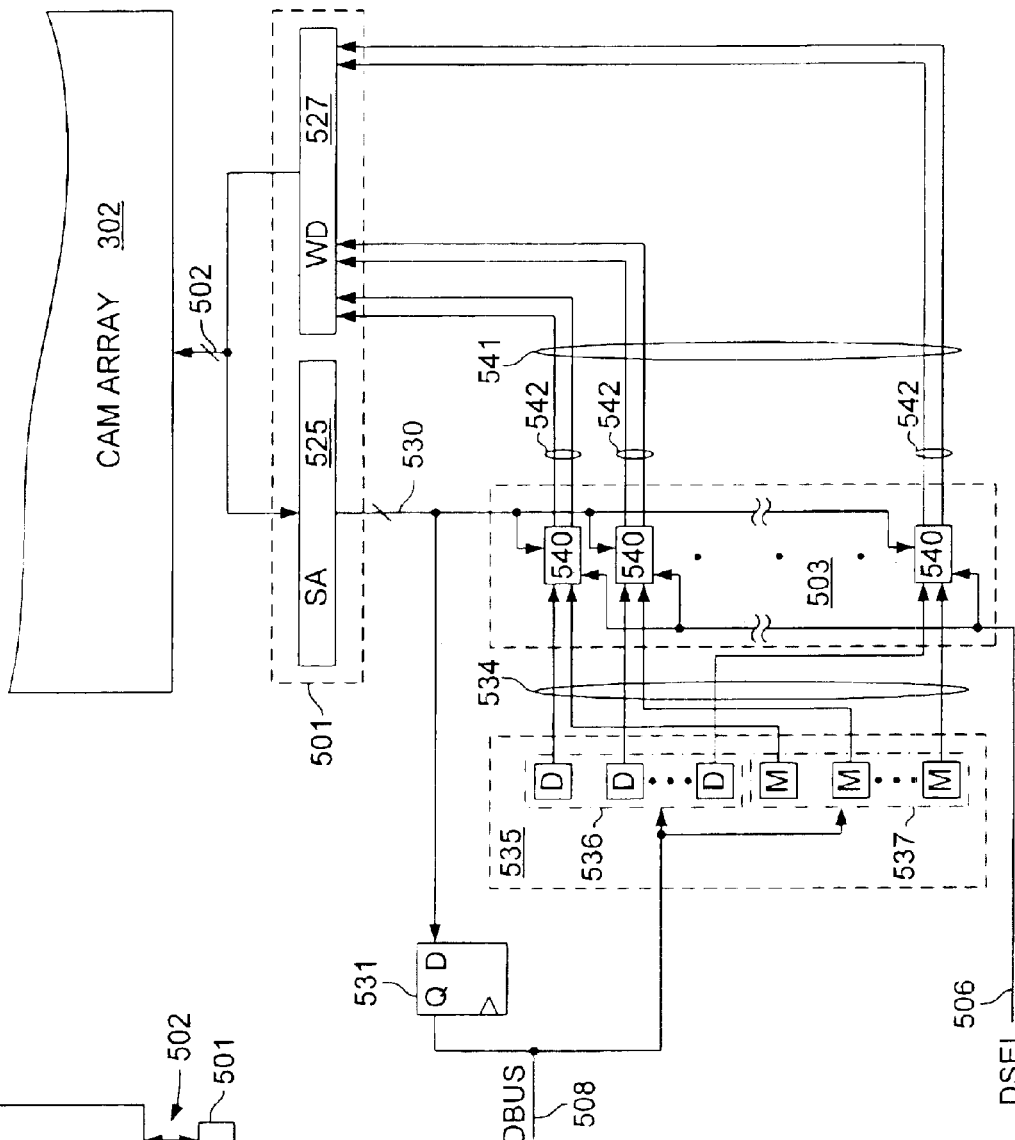
FIG. 13 illustrates a more detailed embodiment of the circuit arrangement of FIG. 12.

FIG. 13 illustrates a more detailed embodiment of the circuit arrangement of FIG. 12. The data bus 508 is coupled to a write latch 535, and a read latch 531. The read latch 531 is coupled via a read data path 530 to a sense amplifier bank 525 within the read/write circuit 501. During a read operation, a read data word is output from a selected row of CAM cells within CAM array 302 onto bit lines 502, amplified by the sense amplifier bank 525, then output onto read data path 530. In one embodiment, the read data word is latched in the read latch 531 (or register) prior to being driven onto the data bus 508 by an output driver circuit (not shown in FIG. 13. In an alternative embodiment, the read latch 531 is omitted and the sense amplifier bank 525 is coupled directly to the output driver circuit. Also, an output enable signal (not shown) may be provided to the read latch 531 to set the output of read latch 531 to a high impedance state until such time as read data is to be output from the read latch 531 to the data bus 508 and/or write latch 535.

In a host write operation, data received via the data bus 508 is stored within a write latch 535. The write latch 535 includes a data latch 536 to store data bits of the write data word, and a mask latch 537 to store mask bits of the write data word. Note that the component storage circuits (i.e., latch circuits, register circuits or other storage elements for storing individual bits of data and mask information) within the data latch 536 and mask latch 537 may be arranged in pairs of adjacent data and mask storage circuits rather than in the separate data and mask circuit blocks 536 and 537.

The data and mask latches 536 and 537 are coupled to the data word translator 503 via signal lines 534. The data word translator 503 includes a number of translation sub-circuits 540 each coupled to receive a respective data bit and corresponding mask bit (i.e., a data/mask bit pair) from the data and mask latches 536 and 537, and each coupled to a data select line to receive the data select signal 506. In one embodiment, each of the translation sub-circuits 540 translates the data/mask bit pair into a quaternary data value in accordance with the translation table of FIG. 7, then outputs either the input data/mask bit pair or the quaternary data value onto a pair of output signal lines 542 depending on the state of the data select signal 506. As discussed in reference to FIG. 7, other quaternary encoding schemes may be used in alternative embodiments.

The signal lines 542 collectively form a write data path 541 for delivering the selected data word (i.e., translated data word formed by a set of quaternary data values, or input data word formed by the input data/mask bit pairs) to a write driver circuit 527 within the read/write circuit 501. The write driver circuit 527 drives the constituent bits of the selected data word onto the bit lines 502 for storage within an address-selected row of the CAM array 302.

In the embodiment of FIG. 13, each of the translation sub-circuits 540 is additionally coupled to receive a respective pair of bits via the read data path 530 (i.e., a portion of a read data word). During a copy or move operation, the data select signal 506 selects the read data path 530 to source the data word output onto the write data path 541 by the translation sub-circuits 540. In an alternative embodiment, copy and move operations may be unsupported and the connection of the read data path to the data word translator 503 may be omitted. Also, the connection of the read data path to the data word translator 503 may be omitted, and copy and/or move operations performed instead by routing a read data word through read latch 531 (if present) and back into the write latch 535.

Still referring to FIG. 13, it should be noted that read and write data words may be transferred to and from the CAM device in a sequence of transfers of component data values (e.g., two transfers of M/2 bits each to transfer a M-bit read or write data word). In the case of a write operation, each component data value may include data and mask bits and therefore may be translated by translate circuit 503 without regard to the content of subsequently received component values. Alternatively, corresponding data and mask bits may be transferred in distinct component values (e.g., data bits in a first transfer and mask bits in a subsequent transfer, or vice-versa). In such an embodiment, one or more component values may be buffered in the write latch 535 or other buffer circuitry until a full complement of data and mask information is received.

FIG. 14 illustrates a translation sub-circuit 540 according to one embodiment. The translation sub-circuit 540 includes an encoding circuit 575 and a select circuit 580, each coupled to receive an input data signal 572 and input mask signal 574, the input signals constituting a component data/mask bit pair of the input data word 534 of FIG. 13. The encoding circuit 575 includes a pair of logic gates 577 and 579, each coupled to receive the data signal 572 and the mask signal 574. In the specific embodiment of FIG. 14, logic gate 577 is an AND gate having a non-inverting input to receive the data signal 572 and an inverting input to receive the mask signal 574, and therefore outputs a constituent bit, X, of a quaternary data value according to the Boolean expression, $X=D*/M$, where "*" denotes a logic AND function. Logic gate 579 is an AND gate having respective inverting inputs to receive the data and mask signals 572, 574 and therefore outputs a constituent bit, Y, of a quaternary data value according to the Boolean expression, $Y=/D*/M$ (note that logic gate 579 is functionally equivalent to a NOR gate). Thus, the encoding circuit 575 generates a quaternary data value in accordance with the table of FIG. 7. As discussed above, other encoding schemes may be used in alternative embodiments.

The select circuit 580 includes a pair multiplexers, 581 and 583, each having a select input coupled to receive the data select signal 506 (DSEL). In the embodiment of FIG. 14, each of the multiplexers 581, 583 has three input ports, and the data select signal 506 includes at least enough constituent bits to select one of the three input ports. Referring to multiplexer 581, a first input port (X) is coupled to receive the X-bit of the quaternary data value from the logic gate 577, a second input port (D) is coupled to receive the input data signal 572, and a third input port (T) is coupled to receive a first bit 576 (RD1) of a read data value (i.e., in support of transfer operations such as copy or move operations). In the second multiplexer 583, a first input port (Y) is coupled to receive the Y-bit of the quaternary data value from the logic gate 579, a second input port (M) is coupled to receive the input mask signal 574, and a third input port (T) is coupled to receive a second bit 578 (RD2) of the read data value. When the data select signal 506 is in a translate state, the select circuit 580 outputs the quaternary data value (i.e., translated bit pair output from the encoding circuit 575) onto write data lines 542. When the data select signal 506 is in a write-through state, the select circuit 580 outputs the input data/mask bit pair onto the write data lines 542 and, when the data select signal 506 is in a transfer state, the select circuit 580 outputs the pair of read data bits, RD1 and RD2, onto the write data lines 542.

In an alternative embodiment, the read data inputs to the multiplexers 581 and 583 are omitted and a single-bit data select signal 506 is used to select between the input bit pair and translated bit pair. In such an embodiment, move and/or copy operations may be achieved through routing of read data bits RD1 and RD2 to the data and mask inputs 572 and 574, or move and copy operations may be unsupported. Also, the multiplexers 581 and 583 may be implemented in a number of ways including, without limitation, using pass gates to allow data presented to the selected input port to pass through to the write data lines 542 (or at least to a next stage driving circuit for driving the write data lines 542), by logic gates (e.g., logic AND gates) used to pass only a DSEL-enabled data source to the write data lines 542, or any other circuit for selectively passing one of the multiple sources of data bits to the write data lines 542.

FIG. 15 illustrates a translation sub-circuit 600 according to alternative embodiment. The translation sub-circuit 600 includes an encoding circuit 575 to translate an input data/ mask bit pair 572/574 into a quaternary data value 606, and a select circuit to select either the input data/mask bit pair 572/574, a translated value 608, or a pair of read data bits 576, 578 (RD1 and RD2) to be output onto write data lines 542 according to the state of a data select signal 506 (DSEL). The translation sub-circuit 600 additionally includes a toggle circuit 605 to selectively invert the state of the quaternary data value 606 according to the state of a match-mode select signal 604 (MMSEL), and thereby enable selection between a forced-match state (XY=00) and a forced-mismatch state (XY=11) of the quaternary data value. In the embodiment of FIG. 15, the toggle circuit 605 includes a pair of exclusive OR gates 607 and 609 each having a first input coupled to receive the match mode select signal (MMSEL), and second inputs coupled to receive the X- and Y-bits, respectively, of the quaternary data value 606. By this arrangement, when the input mask signal 574 is high and the match-mode select signal 604 is low, the forced-match state of the quaternary data value 606 (i.e., XY=00) is output from the toggle circuit 605 without change as the translated value 608. When the input mask bit 574 and the match-mode select signal 604 are both high, the toggle circuit 605 flips the forced-match state of the quaternary data value 606 to the forced-mismatch state, XY=11, in the translated data value 608. Note that logic '1' and logic '0' quaternary values are also complemented when the match-mode select signal is high. In an alternative embodiment, the match-mode select signal 604 may be ANDed with the input mask bit before being applied to the XOR gates 607 and 609 so that the logic '1' and logic '0' states of the quaternary data value 606 are unchanged in the translated data value 608 regardless of the state of the match-mode select signal. In either embodiment, the match-mode select signal 604 may be used to select between forced-match and forced-mismatch quaternary values for each input data/mask bit pair in which the mask bit 574 is set. The forced-match state is useful, for example, to achieve the local masking function described in reference to FIG. 5, and the forced-mismatch state is useful, for example, to ensure that a mismatch condition is signaled by a given row of CAM cells, in effect invalidating the row. Both states, forced-match and forced-mismatch may also be used for other purposes including, without limitation, device testing operations.

In one embodiment, the data select signal 506 of FIGS. 12–15 is generated by the instruction decoder 312 of FIG. 3 in response to an instruction received via IBUS 320. For example, when a write-direct instruction is received by the instruction decoder 312, the instruction decoder 312 outputs the data select signal 506 in the write-through state to select the untranslated data word (i.e., the input data word received via the data bus 508) to be written to the CAM array 302. (Note that the write-direct instruction may be used for any number of purposes including, without limitation, device testing and for writing forced-mismatch data into selected CAM cells of the CAM array 302.) By contrast, when a write-translate instruction is received by the instruction decoder 312, the instruction decoder 312 outputs the data select signal 506 in the translate state to select the translated data word to be written to the CAM array 302. When a copy instruction or move instruction is received by the instruction decoder 312, the instruction decoder 312 outputs the data select signal 506 in the transfer state to select the read data word to be written back to the CAM array at the copy or move destination.

In an alternative embodiment, a configuration circuit within the CAM device 300 of FIG. 3 may be run-time or production-time programmed with a data select value (e.g., in response to a host instruction or via signals delivered by external programming equipment) to establish the state of the data select signal 506. The configuration circuit may be a register, latch, non-volatile memory, fusible circuit or any other circuit capable of storing or generating a data select value. As with the data select signal 506, the match-mode select signal 604 of FIG. 15 may be generated by the instruction decoder 312 of FIG. 3 (or other control circuit) in response to a host instruction, or by a configuration circuit programmed with a match-mode select value.

Multi-Compare CAM Cell Having Shared Data-Switched Transistors

FIG. 16 illustrates a multi-compare CAM cell 630 according to another embodiment. CAM cell 630 includes a pair of memory cells 381 and 383 coupled to a dual-compare circuit 631. The dual-compare circuit 631 includes a first compare circuit formed by transistors 632, 634, 636 and 638, and a second compare circuit (indicated by shading in FIG. 16) formed by transistors 632, 634, 640 and 642. Thus, the transistors 632 and 634 controlled by memory cells 381 and 383 (i.e., the data-switched transistors) are shared between the first and second compare circuits of CAM cell 630, thereby reducing the overall number of transistors required to achieve dual compare operation relative to the CAM cell 380 of FIG. 6.

Transistors 638 and 636 of the first compare circuit are controlled by a first complementary pair of comparand signals, C1 and /C1, respectively, and have drain terminals coupled to a first match line 384 (ML1). Consequently, when C1 and /C1 become valid on compare lines 396 and 398, a compare operation is enabled in the first compare circuit, establishing a path between the match line 384 and reference voltage node 645 (a ground node in this example) if the quaternary data value stored in memory cells 381 and 383 does not match C1. That is, if the quaternary value is a logic '1' (XY=10), and the comparand value, C1, is a logic '0', then transistors 632 and 636 are switched on to establish a path between match line 384 and ground, thereby signaling the mismatch condition. If the quaternary data value is a logic '0' (XY=01) and the comparand value, C1, is a logic '1', then transistors 634 and 638 are switched on to establish a path between the match line 384 and ground.

Transistors 642 and 640 are controlled by a second complementary pair of comparand signals, C2 and /C2, respectively, and have drain terminals coupled to a second match line 386 (ML2). Consequently, when C2 and /C2 become valid on compare lines 400 and 402, a compare operation is enabled in the second compare circuit, establishing a path between the match line 386 and reference voltage node 645 if the quaternary data value stored in memory cells 381 and 383 does not match C2. That is, if the quaternary value is a logic '1' (XY=10), and the comparand value, C2, is a logic '0', then transistors 632 and 640 are switched on to establish a path between match line 386 and ground (signaling the mismatch condition). If the quaternary data value is a logic '0' (XY=01) and the comparand value, C2, is a logic '1', then transistors 634 and 642 are switched on to establish a path between match line 386 and ground.

Reflecting on the operation of the dual compare circuit 630, it should be noted that if complementary comparand signal pairs are driven onto respective compare line pairs 396/398 and 400/402 concurrently (i.e., at least partly overlapping in time), then a path may be formed between match lines 384 and 386 via transistor pair 636/640 or transistor pair 638/642. Consequently, if one of the match lines 384 or 386 is pulled low by another CAM cell, the other of the match lines may undesirably be pulled low through the path formed by transistor pair 636/640 or 638/642. In one embodiment, this consequence is avoided by pipelining the assertion of complementary comparand signals on compare line pairs 396/398 and 400/402 so that, during the interval in which match line 384 is being sampled by downstream logic (e.g., a priority encoder or other logic circuit), the compare lines 400 and 402 are both held low to prevent formation of a path between match lines 384 and 386, and, conversely, during the interval in which match line 386 is being sampled, the compare lines 396 and 398 are both held low. In such an embodiment the compare line pairs 396/398 and 400/402 may still be driven concurrently with complementary comparand signals, but during at least some time interval in the compare operation within each of the compare circuits of CAM cell 630, the compare line pair coupled to the alternate compare circuit is driven low (i.e., both compare lines low) to enable match line sampling. In alternative embodiments, additional circuitry may be included within the CAM cell 630 to isolate the match lines 384 and 386 from one another when complementary comparand signals are present on both compare line pairs 396/398 and 400/402. For example, a first compare-enable transistor may be coupled between match line 384 and the drain terminals of transistors 636 and 638, and switched on in response to a first compare enable signal. Similarly, a second compare-enable transistor may be coupled between match line 386 and the drains of transistors 640 and 642, and switched on in response to a second compare enable signal. By alternately asserting the first and second compare enable signals, an interleaved, pipelined set of compare operations may be performed in the dual compare circuit.

In an alternative embodiment, the dual compare circuit 630 of FIG. 16 may include a single memory cell having complementary data outputs (e.g., D and /D) coupled to the transistors 632 and 634. In yet other embodiments, the dual compare circuit of FIG. 16 may include a memory cell having complementary data outputs coupled to transistors 632 and 634, and a mask storage cell coupled to the gate of a masking transistor or gates of masking transistors (not shown in FIG. 16) to prevent a path from being established between match line 384 (and/or match line 386) and the reference voltage node 645, regardless of the state of the data stored in the memory cell. For example, a masking transistor may be coupled between the reference voltage node 645 and the source terminals of transistors 632 and 634 (e.g., to prevent either of match lines 384 and 386 from being pulled to ground). Alternatively, a first masking transistor may be coupled between match line 384 and the drain terminals of transistors 636 and 638, and/or a second masking transistor may be coupled between match line 386 and the drain terminals of transistors 640 and 642. Also, masking transistors may be coupled between the outputs of the memory cell and the gates of transistors 632 and 634 (enabling transistors 632 and 634 to be isolated from the memory cell to achieve a forced-match state), or between either or both compare line pairs 396/398 and 400/402 and the gates of corresponding transistor pairs 636/638 and 640/642 (enabling each of the compare circuits of CAM cell 630 to be isolated from the corresponding compare line pair to achieve a forced-match state).

It should be noted that while a dual compare circuit is depicted in FIG. 16 and described above, additional transistor pairs may be added in parallel with transistor pairs 636/638 and 640/642 (and coupled to additional match lines) to provide additional compare circuits that share the same pair of data-controlled transistors 632 and 634.

Physical Layout of Multi-Compare CAM Cell

Figure 17:
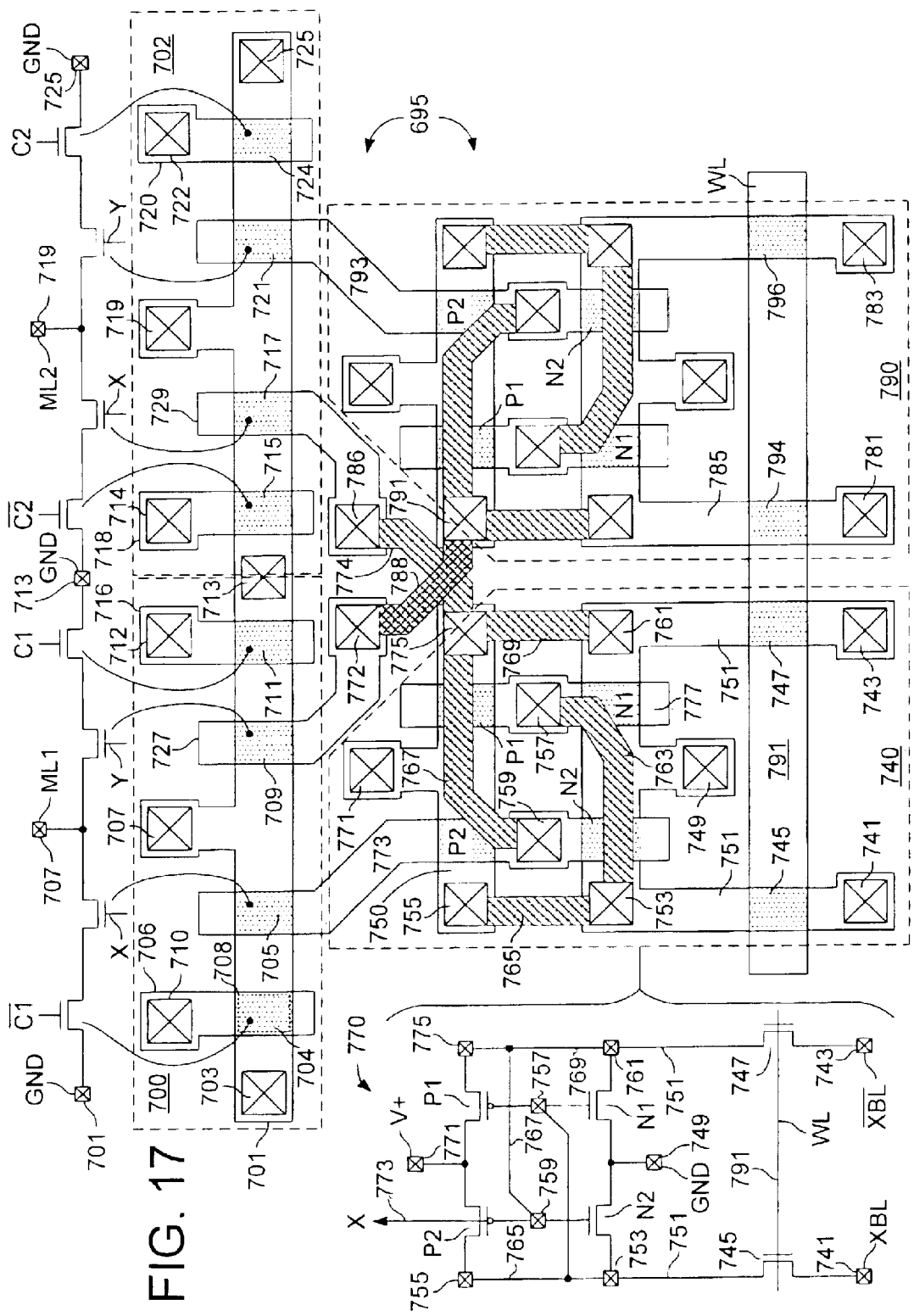
FIG. 17 illustrates a layout of a dual-compare CAM cell in a semiconductor substrate according to one embodiment.

FIG. 17 illustrates a layout of a dual-compare CAM cell 695 in a semiconductor substrate according to one embodiment. The CAM cell includes first and second memory cells 740 and 790, and first and second compare circuits 700 and 702 each formed by disposition of diffusion features (also referred to as diffusion regions) in an underlying substrate, and disposition of polysilicon features, contacts and metal layers relative to the diffusion features.

The memory cells 740, 790 and compare circuits 700, 702 each include a number of transistors formed by polysilicon features disposed over diffusion regions. For example, polysilicon feature 706 overlaps a diffusion region 701 at area 708 (indicated in dashed outline) to form an NMOS transistor 704. The overlap area 708 constitutes the gate of the transistor 704, and the portions of the diffusion region 701 on either side of the overlap area 708 constitute drain and source terminals of the transistor 704 (the device being symmetric so that the drain and source are interchangeable). PMOS transistors are formed, for example, in appropriately doped wells within the underlying substrate.

Compare circuit 700 includes polysilicon features 706 and 716 coupled via respective compare-line contacts 710 and 712 to a pair of compare lines to receive complementary comparand signals, /C1 and C1, respectively. Compare circuit 702 similarly includes polysilicon features 718 and 720 coupled via respective compare-line contacts 714 and 722 to a pair of compare lines to receive complementary comparand signals, /C2 and C2, respectively. Reference contacts 703, 713 and 725 are coupled to a ground line (or ground plane) or another reference voltage node, and are disposed at opposite ends, and in the middle of, the diffusion region 701. In compare circuit 700, a first match line contact 707 is disposed within the diffusion region 701 between reference contacts 703 and 713 and is coupled to a first match line, ML1. In compare circuit 702, a second match line contact 719 is disposed within the diffusion region 701 between reference contacts 713 and 725 and is coupled to a second match line, ML2. The compare lines, match lines and reference voltage lines are not shown in FIG. 17 to avoid obscuring the CAM cell 695.

Compare circuit 700 includes transistors 704, 705, 709 and 711 formed by areas of overlap between polysilicon features 706, 773, 727 and 712, respectively, and the diffusion region 701. Transistors 704 and 711 are controlled by complementary comparand signals, /C1 and C1, respectively, and transistors 705 and 709 are coupled via polysilicon features 773 and 727 to receive the X- and Y-bits, respectively, of a quaternary data value stored within the memory cells 740 and 790. Transistors 704 and 705 are disposed between reference contact 703 and match line contact 707 to form a first sub-circuit of compare circuit 700, and transistors 709 and 711 are disposed between reference contact 713 and match line contact 707 to form a second sub-circuit of compare circuit 700. By this arrangement, if the comparand value, C1, does not match the quaternary data value stored in the memory cells 740 and 790, then either transistor pair 704/705 will be switched on (i.e., when XY=10 and C1=0) or transistor pair 709/711 will be switched on (i.e., when XY=01 and C1=1) to establish a path between match line, ML1, and the reference voltage at contact 703 or 713 and thereby signal the mismatch condition.

Compare circuit 702 includes transistors 724, 721, 717 and 715 formed by areas of overlap between polysilicon features 720, 793, 729 and 718, respectively, and the diffusion region 701. Transistors 724 and 715 are controlled by complementary comparand signals, C2 and /C2, respectively, and transistors 717 and 721 are coupled, via polysilicon features 729 and 793, to receive the X- and Y-bits, respectively, of the quaternary data value stored within the memory cells 740 and 790. Transistors 724 and 721 are disposed between reference contact 725 and match line contact 719 to form a first sub-circuit of compare circuit 702, and transistors 715 and 717 are disposed between reference contact 713 and match line contact 719 to form a second sub-circuit of compare circuit 702. By this arrangement, if the comparand value, C2, does not match the quaternary data value stored in the memory cells 740 and 790, then either transistor pair 715/717 will be switched on (i.e., when XY=10 and C2=0) or transistor pair 721/724 will be switched on (i.e., when XY=01 and C2=1) to establish a path between match line, ML2, and the reference voltage at contact 725 or 713 and thereby signal the mismatch condition.

In the embodiment of FIG. 17, memory cells 740 and 790 are mirror images of one another (identical cells rather than mirror image cells may alternatively be used), each including a pair of inverters coupled input-to-output to form a bi-stable latch. Referring to memory cell 740, a first inverter is formed by the extension of polysilicon feature 777 across diffusion regions 750 and 751 to form gate-to-gate coupled transistors P1 and N1, and a second inverter is formed by the extension of polysilicon feature 773 across diffusion regions 750 and 751 to form gate-to-gate coupled transistors P2 and N2. Diffusion region 750 is coupled to a supply voltage node (or other logic high voltage source) via contact 771, and diffusion region 751 is coupled to a ground reference node (or other logic low voltage source) via contact 749. Thus, in the exemplary embodiment of FIG. 17, transistors P1 and P2 are PMOS transistors having source terminals coupled to a high logic voltage, and transistors N1 and N2 are NMOS transistors having source terminals coupled to a low logic voltage. Metal layer trace 769 extends between contacts 761 and 775 to couple the drains of transistors P1 and N1, thereby forming an output node of the first inverter. Similarly, metal layer trace 765 extends between contacts 753 and 755 to couple the drains of transistors P2 and N2, thereby forming an output node of the second inverter. Metal layer trace 767 extends between contacts 759 and 775 to couple the output node of the first inverter to the input of the second inverter, and metal layer trace 763 extends between the contacts 753 and 757 to couple the output node of the second inverter to the input of the first inverter. The output node of the first inverter constitutes the data output of the memory cell and is used to supply a first bit (e.g., an X-bit) of a quaternary data value to compare circuits 700 and 702. A schematic diagram corresponding to the feature layout of memory cell 740 is depicted at 770, with transistors, contacts and conductive structures having like reference numerals to counterpart components within the memory cell 740. Memory cell 790 is a mirror image (or stepped image) of memory cell 740 and supplies the second bit (e.g., a Y-bit) of the quaternary data value to the compare circuits 700 and 702.

Contacts 741 and 743 are disposed within diffusion region 751 of memory cell 740 and coupled to respective bit lines XBL and /XBL of a first bit line pair.(not shown) to enable read and write access to the memory cell 740. Contacts 781 and 783 are similarly disposed within diffusion region 785 of memory cell 790 to enable read and write access to the memory cell 790. A polysilicon feature 791 extends across each of the diffusion regions 751 and 785 to form pass-gate transistors 745 and 747 between bit line contacts 741 and 743 and input nodes of the cross-coupled inverters of memory cell 740, and to form pass-gate transistors 794 and 796 between bit line contacts 781 and 783 and input nodes of the cross-coupled inverters of memory cell 790. Thus, the polysilicon feature 791 constitutes a word line (WL) which, when driven with a logic high signal, switches on transistor pairs 745/747 and 794/796 to enable read and write access to the memory cells 740 and 790, respectively. In alternative embodiments, separate word lines may be used to enable access to the memory cells 740 and 790.

In the embodiment of FIG. 17, memory cell 740 is disposed adjacent compare circuit 700 so that polysilicon feature 773 may be extended directly (i.e., without metal layer connection or other additional continuity structure) to compare circuit 700 to couple the data output of the memory cell 740 to the gate of transistor 705. Similarly, memory cell 790 is disposed adjacent compare circuit 702 so that polysilicon feature 793 may be extended directly to compare circuit 702 to couple the data output of memory cell 790 to the gate of transistor 721. The memory cell 740 is further from compare circuit 702 making it difficult to extend a polysilicon feature from memory cell 740 to transistor 717 of compare circuit 702. It is similarly difficult to extend a polysilicon feature from memory cell 790 to transistor 709 of compare circuit 700. That is, constraints regarding the proximity of various diffusion and polysilicon features to one another, imperfections that often result at feature turns (e.g., right angles or other angles in features) make it difficult to extend a polysilicon feature from either of memory cells 740 and 790 to a transistor in the more distant compare circuit without having to move (disperse) other features within the CAM cell 695. Accordingly, in the embodiment of FIG. 17, a metal trace 774 in a first metal layer is routed from contact 775 to a contact 786 disposed on polysilicon feature 729 (the feature coupled to the gate of transistor 717), and a metal trace 788 in a second metal layer is routed from contact 791 of memory cell 790 to a contact 772 disposed on polysilicon feature 727 (the feature coupled to transistor 709), thereby achieving a crisscrossed coupling of memory cell 740 to compare circuit 702 and memory cell 790 to compare circuit 700. The first and second metal layers are separated by an insulating layer (e.g., silicon dioxide or other insulating material) to prevent shorting between the crisscrossed metal traces. Despite the layout challenges, a polysilicon feature may be extended from one of the memory cells to the remote compare circuit (i.e., from memory cell 740 to compare circuit 702 or from memory cell 790 to compare circuit 700) in an alternative embodiment. In such an embodiment, the remaining memory cell/compare circuit pair may be coupled to one another via a metal layer trace formed in the same metal layer, or a different metal layer, as the metal layer traces used to couple the nodes of the memory cells themselves (e.g., metal layer traces 763, 765, 767 and 769).

Figure 18:
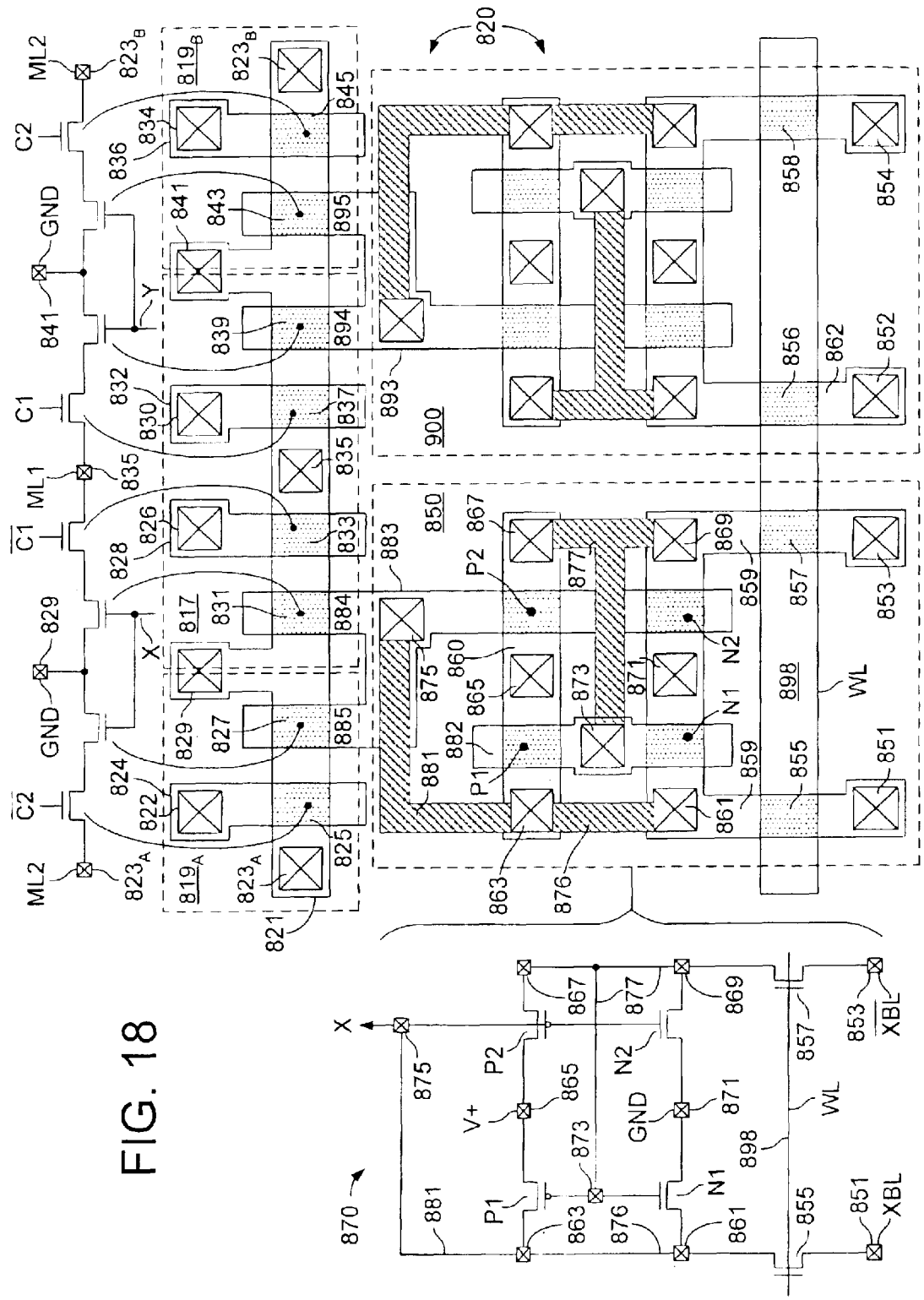
FIG. 18 illustrates a layout of a dual-compare CAM cell in a semiconductor substrate according to an alternative embodiment.

FIG. 18 illustrates a layout of a dual-compare CAM cell 820 in a semiconductor substrate according to an alternative embodiment. The CAM cell 820 includes first and second memory cells 850 and 900, and first and second compare circuits 817 and 819 each formed by disposition of diffusion regions in an underlying substrate, and disposition of polysilicon features, contacts and metal layers relative to the diffusion regions.

In contrast to the CAM cell layout of FIG. 17, in which the constituent sub-circuits of compare circuits 700 and 702 are disposed together in opposite halves of a diffusion region (i.e., sub-circuits of compare circuit 700 are disposed on one half of the diffusion region 701, and sub-circuits of compare circuit 702 are disposed on the other half of the diffusion region), the constituent sub-circuits, 819$_A$ and 819$_B$, of compare circuit 819 are disposed on distinct portions of diffusion region 821 on opposite sides of the compare circuit 817. This alternative arrangement of sub-circuits permits the compare sub-circuits coupled to memory cell 850 (i.e., the X-coupled sub-circuits), to be disposed adjacent one another and adjacent the X memory cell 850, and similarly permits the compare sub-circuits coupled to memory cell 900 (i.e., the Y-coupled sub-circuits) to be disposed adjacent one another and adjacent the Y memory cell 900. Consequently, crisscrossed coupling between memory cells and compare circuits (i.e., as in the CAM cell 695 of FIG. 17) may be omitted, thereby forming the memory cells and the compare circuits of the CAM cell 820 using a single metal layer. Also, the coupling between memory cells 850, 900 and compare circuits 817, 819 is achieved solely through polysilicon features 883 and 893 and without metal layer conductors (although metal layers may be used for memory cell-to-compare circuit coupling in alternative embodiments). Moreover, omission of the crisscrossed coupling and use of relatively straight-line polysilicon features to establish connections between the memory cells 850, 900 and compare circuits 817, 819 (i.e., in contrast to angled features) enables the CAM cell 820 to be formed in a smaller overall area than the CAM cell 695 of FIG. 17, increasing the overall number of CAM cells that can be formed within a given die area (i.e., increasing the cell density of the CAM array).

Compare circuit 817 includes polysilicon features 828 and 832 coupled via respective compare-line contacts 826 and 830 to a pair of compare lines to receive complementary comparand signals, /C1 and C1, respectively. Compare circuit 819 (formed by constituent sub-circuits 819$_A$ and 819$_B$) similarly includes polysilicon features 824 and 836 coupled via respective compare-line contacts 822 and 834 to a pair of compare lines to receive complementary comparand signals, /C2 and C2, respectively. Reference contact 829 is coupled to a ground reference line (or ground plane) or other reference voltage node, and is disposed on diffusion region 821 at a boundary between compare circuit 817 and sub-circuit 819$_A$ of compare circuit 819. Reference contact 841 is similarly coupled to a ground reference line (or ground plane) or other reference voltage node, and is disposed within the diffusion region 821 at a boundary between compare circuit 817 and sub-circuit 819$_B$ of compare circuit 819. By this arrangement, each sub-circuit 819$_A$ and 819$_B$ of compare circuit 819 shares a reference contact with compare circuit 817.

A first match line contact 835 is coupled to a first match line, ML1, and disposed on the diffusion region 821 within compare circuit 817. Second and third match line contacts 823$_A$ and 823$_B$ are disposed on the diffusion region 821 at opposite ends of the CAM cell 820 (i.e., within compare sub-circuits 819$_A$ and 819$_B$, respectively) and are each coupled to a second match line, ML2. Thus, the sub-circuits of compare circuit 817 share match line contact 835, and the sub-circuits 819$_A$ and 818$_B$ of compare circuit 819 have dedicated match line contacts 823$_A$ and 823$_B$, respectively. In one embodiment, a respective match line contact 823 is disposed at each boundary between CAM cells 820 within a row, so that a sub-circuit 819$_A$ within one CAM cell 820 shares a match line contact 823 with the sub-circuit 819$_B$ of an adjacent CAM cell 820. This arrangement is discussed in further detail below.

Compare circuit 817 includes transistors 831, 833, 837 and 839 formed by areas of overlap between polysilicon features 883, 828, 832 and 893, respectively, and the diffusion region 821. Transistors 833 and 837 are controlled by complementary comparand signals, /C1 and C1, respectively, and transistors 831 and 839 are controlled, via first extensions 884 and 894 of forked polysilicon features 883 and 893, by the X- and Y-bits, respectively, of a quaternary data value stored within the memory cells 850 and 900. Transistors 831 and 833 are disposed between reference contact 829 and match line contact 835 to form a first sub-circuit of compare circuit 817, and transistors 837 and 839 are disposed between reference contact 841 and match line contact 835 to form the second sub-circuit of compare circuit 817. By this arrangement, if the comparand value, C1, does not match the quaternary data value stored in the memory cells 850 and 900, then either transistor pair 831/833 will be switched on (i.e., when XY=10 and C1=0) or transistor pair 837/839 will be switched on (i.e., when XY=01 and C1=1) to establish a path between match line, ML1, and a reference voltage line and thereby signal the mismatch condition.

Compare circuit 819 includes transistors 825, 827, 843 and 845 formed by areas of overlap between polysilicon features 824, 883, 893 and 836, respectively, and the diffusion region 821. Transistors 825 and 845 are controlled by complementary comparand signals, /C2 and C2, respectively, and transistors 827 and 843 are controlled, via second extensions 885 and 895 of forked polysilicon features 883 and 893, by the X- and Y-bits, respectively, of the quaternary data value stored within the memory cells 850 and 900. Note that, in alternative embodiments, rather than a forked structure having branching extensions 884 and 885, polysilicon feature 883 may be a hook-shaped (or J-shaped) feature that extends over the diffusion region 821 to form the transistor 831, then turns (hooks) back to overlap the diffusion region again to form transistor 827. Alternatively, the hook-shaped polysilicon feature may first pass over the diffusion region to form transistor 827, then hook back to form transistor 831. Polysilicon feature 893 may similarly be a hook-shaped (or J-shaped) feature instead of a forked feature. More generally, any polysilicon feature that extends from the memory cell 850 (and/or memory cell 900) to form a pair of data-controlled transistors within the diffusion region 821 may be used without departing from the spirit and scope of the present invention.

Still referring to compare circuit 819, transistors 825 and 827 are disposed between reference contact 829 and match line contact 823$_A$ to form sub-circuit 819$_A$ of compare circuit 819, and transistors 843 and 845 are disposed between reference contact 841 and match line contact 823$_B$ to form sub-circuit 819$_B$ of compare circuit 819. By this arrangement, if the comparand value, C2, does not match the quaternary data value stored in the memory cells 850 and 900, then either transistor pair 825/827 will be switched on (i.e., when XY=10 and C2=0) or transistor pair 843/845 will be switched on (i.e., when XY=01 and C2=1) to establish a path between match line, ML2, and a reference voltage line and thereby signal the mismatch condition.

In the embodiment of FIG. 18, memory cells 850 and 900 are mirror images of one another (identical cells rather than mirror image cells may alternatively be used), each including a pair of inverters coupled input-to-output to form a bi-stable latch. Referring to memory cell 850, a first inverter is formed by the extension of polysilicon feature 882 across diffusion regions 860 and 859 to form gate-to-gate coupled transistors P1 and N1, and a second inverter is formed by the extension of polysilicon feature 883 across diffusion regions 860 and 859 to form gate-to-gate coupled transistors P2 and N2. Diffusion region 860 is coupled to a supply voltage node (or other logic high voltage source) via contact 865 and is disposed within a N-well (not shown), and diffusion region 859 is coupled to a ground reference node (or other logic low voltage source) via contact 871. Thus, in the exemplary embodiment of FIG. 18, transistors P1 and P2 are PMOS transistors having source terminals coupled to a high logic voltage, and transistors N1 and N2 are NMOS transistors having source terminals coupled to a low logic voltage. Metal layer trace 876 extends between contacts 863 and 861 to couple the drains of transistors P1 and N1, thereby forming an output node of the first inverter. Similarly, metal layer trace 877 extends between contacts 867 and 869 to couple the drains of transistors P2 and N2, thereby forming an output node of the second inverter. Metal layer trace 881 extends from contact 863 to a contact 875 disposed on polysilicon feature 883 to couple the output node of the first inverter to the input of the second inverter, and metal layer trace 877 extends between contacts 867 (and 869) and a contact 873 disposed on polysilicon feature 882 to couple the output node of the second inverter to the input of the first inverter. The output node of the first inverter constitutes the data output of the memory cell and is used to supply a first bit (e.g., an X-bit) of a quaternary data value to the transistor 827 within subcircuit $818_A$ of compare circuit 819 and to transistor 831 of the first sub-circuit of compare circuit 817. A schematic diagram corresponding to the feature layout of memory cell 850 is depicted at 870, with transistors, contacts and conductive structures having like reference numerals to counterpart components within the memory cell 850. Memory cell 900 is a mirrored or stepped image of memory cell 850 and supplies the second bit (e.g., a Y-bit) of the quaternary data value to transistor 843 within subcircuit $818_B$ of compare circuit 819 and to transistor 839 of the second sub-circuit of compare circuit 817.

Contacts 851 and 853 are disposed within diffusion region 859 of memory cell 850 and coupled to respective bit lines XBL and /XBL of a first bit line pair (not shown) to enable read/write access to memory cell 850. Contacts 852 and 854 are similarly disposed within diffusion region 862 of memory cell 900 to enable read and write access to the memory cell 900. A polysilicon feature 898 extends across each of the diffusion regions 859 and 862 to form pass-gate transistors 855 and 857 between bit line contacts 851 and 853 and input nodes of the cross-coupled inverters of memory cell 850, and to form pass-gate transistors 856 and 858 between bit line contacts 852 and 854 and input nodes of the cross-coupled inverters of memory cell 900. Thus, the polysilicon feature 898 constitutes a word line (WL) which, when driven with a logic high signal, switches on transistor pairs 855/857 and 856/858 to enable read and write access to the memory cells 850 and 900, respectively. In alternative embodiments, separate word lines may be used to enable access to the memory cells 850 and 900.

Although the CAM cells of FIGS. 17 and 18 have been described in terms of complementary-MOS (CMOS) process technology and materials, other process technologies and materials may be used in alternative embodiments. For examples, materials other than polysilicon may be used to form transistors, and materials other than metal may be used to implement the conductive traces used to couple contact pairs to one another. Also, while an underlying semiconductor substrate is described, other types of substrate materials may be used.

FIGS. 19A and 19B illustrate the CAM cells 695 and 820 of FIGS. 17 and 18 in schematic form and are provided to enable side-by-side comparison of the different compare circuit arrangements. Referring first to FIG. 19A, CAM cell 695 includes memory cells 740 and 790, and first and second compare circuits 700 and 702, each including a pair of sub-circuits $700_A/700_B$ and $702_A/702_B$, respectively. In compare circuit 700, sub-circuit $700_A$ includes transistors 704 and 705 respectively coupled to receive complemented comparand signal /C1 and the X-bit of a quaternary data value from memory cell 740, and sub-circuit $700_B$ includes transistors 711 and 709 respectively coupled to receive comparand signal, C1, and the Y-bit of the quaternary data value from memory cell 790. Similarly, in compare circuit 702, sub-circuit $702_A$ includes transistors 715 and 717 respectively coupled to receive complemented comparand signal /C2 and the X-bit of the quaternary data value from memory cell 740, and sub-circuit $702_B$ includes transistors 724 and 721 respectively coupled to receive comparand signal C2 and the Y-bit of the quaternary data value from memory cell 790. Compare circuit 700 is coupled to match line 384 (ML1) at node 906, and compare circuit 702 is coupled to match line 386 (ML2) at node 908. As discussed in reference to FIG. 17, the signal path that couples the X memory cell to compare circuit 702 and the signal path that couples the Y memory cell to compare circuit 700 cross one another (i.e., one crossing over the other) as indicated by reference numeral 921.

Referring to FIG. 19B, CAM cell 820 includes memory cells 850 and 900, and compare circuits 817 and 819, with each compare circuit including a respective pair of sub-circuits $817_A/817_B$ and $819_A/819_B$. In compare circuit 817, sub-circuit $817_A$ includes transistors 833 and 831 respectively coupled to receive complemented comparand signal /C1 and the X-bit of a quaternary data value from memory cell 850, and sub-circuit $817_B$ includes transistors 837 and 839 respectively coupled to receive comparand signal, C1, and the Y-bit of the quaternary data value from memory cell 900. In compare circuit 819, sub-circuit $819_A$ includes transistors 825 and 827 respectively coupled to receive complemented comparand signal /C2 and the X-bit of the quaternary data value from memory cell 850, and sub-circuit $819_B$ includes transistors 845 and 843 respectively coupled to receive comparand signal C2 and the Y-bit of the quaternary data value from memory cell 900.

As discussed in reference to FIG. 18, the sub-circuits $819_A$ and $819_B$ of compare circuit 819 are disposed on either side of the compare circuit 817. By this physical arrangement of the compare sub-circuits $819_A$ and $819_B$, the transistors 827 and 831 coupled to memory cell 850 may be disposed in close proximity to one another (e.g., on either side of a ground contact 829 as illustrated in FIG. 18) and adjacent the X memory cell 850, thereby enabling memory cell 850 to be coupled to the compare sub-circuits $819_A$ and $817_A$ through a relatively short-haul conductive feature (e.g., the polysilicon feature 883 of FIG. 18). Similarly, the transistors 839 and 843 coupled to memory cell 900 may be disposed in close proximity to one another and adjacent the Y memory cell 900, thereby enabling memory cell 900 to be coupled to the compare sub-circuits $817_B$ and $819_B$ through a relatively short-haul conductive feature (e.g., the polysilicon feature 893 of FIG. 18). Also, the arrangement of transistors 827 and 831 adjacent memory cell 850, and transistors 839 and 843 adjacent memory cell 900 allows the memory cells 850 and 900 to be coupled to the respective transistor pairs 827/831 and 839/843 without the crossing conductive structures of FIG. 19A, thereby making it possible to establish all connections between the memory cells 850, 900 and the compare circuits 817, 819 in a single layer of conductive material (e.g., polysilicon as in FIG. 18, or metal or another layer of conductive material). Also, as discussed in reference to FIG. 18, the short-haul connections between memory cells 850 and 900 and transistors within the compare circuits 817 and 819, may reduce the number of angled features within the CAM cell layout, thereby enabling a reduced-size CAM cell and correspondingly higher-density CAM array.

Still referring to FIG. 19B, it should be noted that the distribution of compare sub-circuits $819_A$ and $819_B$ on opposite sides of compare circuit 817 results in a different arrangement of compare lines 396, 398, 400 and 402 than in CAM cell 695 of FIG. 19B. More specifically, in CAM cell 695, the compare line pairs used to carry complementary comparand data, 396/398 and 400/402, are disposed side by side. By contrast, in CAM cell 820, compare lines 400 and 402 are disposed on either side of compare line pair 396/398 to deliver complementary comparand data to the distributed sub-circuits $819_A$ and $819_B$, respectively.

Figure 20:
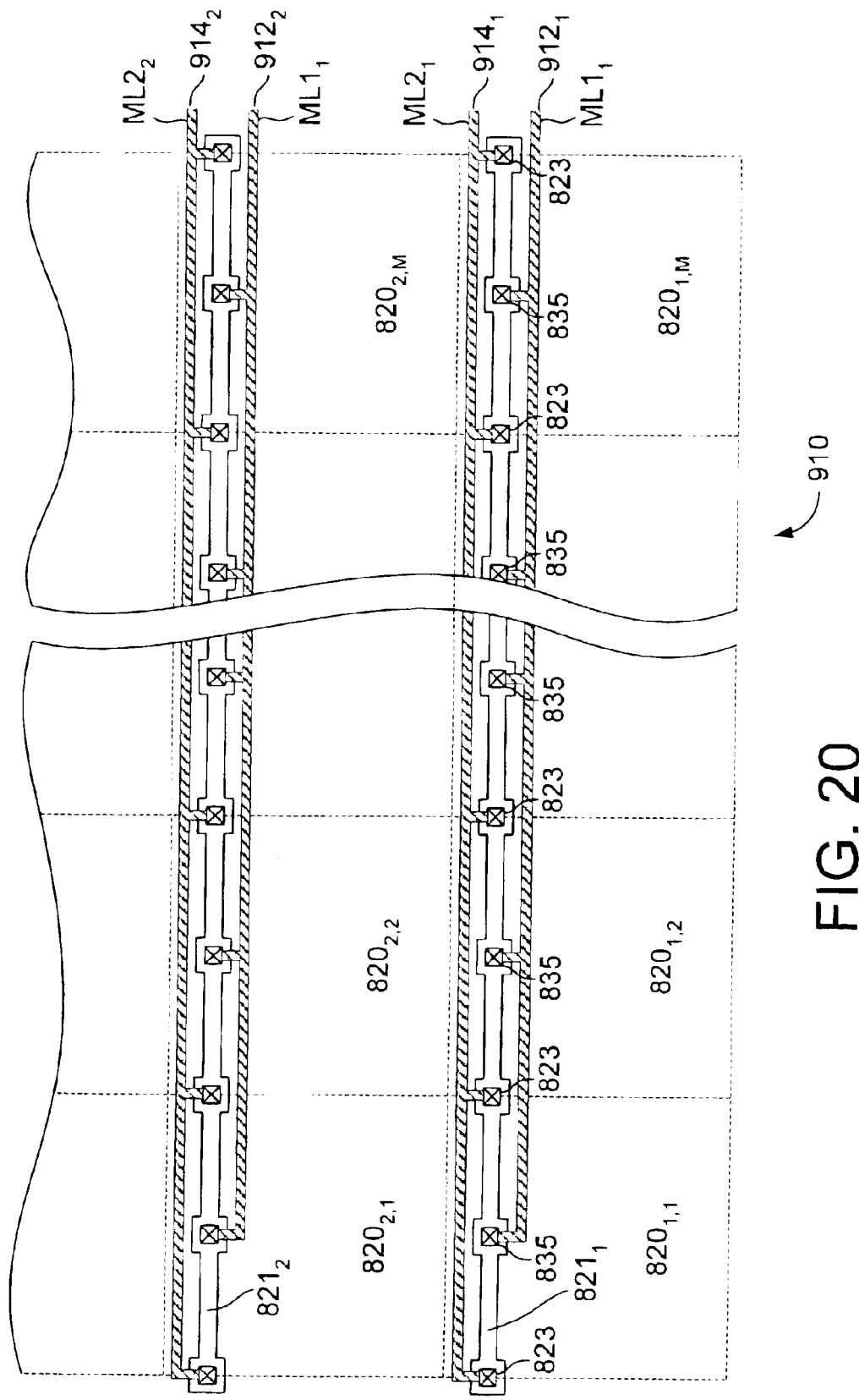
FIG. 20 illustrates an array of the CAM cells of FIG. 18 according to one embodiment.

FIG. 20 illustrates a portion of an exemplary array 910 of CAM cells 820 of FIG. 18 to illustrate features of the array that extend beyond boundaries of a single CAM cell 820. In particular, a respective diffusion region 821 (i.e., that corresponds to the diffusion region 821 described in reference to FIG. 18) extends continuously across each row of CAM cells from one end of the array to the other. That is, diffusion region $821_1$ extends across the M CAM cells $820_{1,1}$–$820_{1,M}$ of a first row; diffusion region $821_2$ extends across the M CAM cells $820_{2,1}$–$820_{2,M}$ of a second row; and so forth. Similarly, a pair of match lines 912, 914 extends across each row of CAM cells and is coupled to contacts within the diffusion region 821. Note that the match lines themselves need not overlay the row of CAM cells to which they are coupled. For example, match line $914_1$, though coupled to diffusion region $821_1$ of the first CAM cell row, may extend lengthwise over the CAM cells $820_{2,1}$–$820_{2,M}$ of the second row, and match line $914_2$ may likewise extend over the CAM cells of the third row.

Referring specifically to the first row of CAM cells $820_{1,1}$–$820_{1,M}$, contacts 825 are disposed within the diffusion region $821_1$, each contact 825 being substantially centered between the boundaries of a respective CAM cell 820 and coupled to match line $912_1$ ($ML1_1$). Contacts 823 are disposed within the diffusion region $821_1$ at each CAM cell boundaries and coupled to the match line $914_1$ ($ML2_1$). By this arrangement, an alternating sequence of contacts to match lines 912 and 914 is achieved along the length of each row of CAM cells 820. Also, because each of the match line contacts 823 disposed at a boundary between two CAM cells (i.e., as opposed to the outermost boundaries of end CAM cells such as cells $820_{1,1}$ and $820_{1,M}$), such match line contacts may be shared between the CAM cells. That is, referring to FIGS. 18 and 20, compare sub-circuit $819_B$ within one CAM cell 820 shares a match line contact with compare sub-circuit $819_A$ of the adjacent CAM cell 820. Thus, even though the CAM cell 820 of FIG. 18 has a single contact to match line ML1, and two contacts to match line ML2, the sharing of contacts 823 between adjacent CAM cells 820 of the same row enables the total number of match line contacts to be substantially equal for each match line, ML1 and ML2. In the specific embodiment of FIG. 20, because the number of CAM cells 820, M, in each row is one less than the number of CAM cell boundaries, M+1, (i.e., M CAM cells having M−1 shared boundaries and two outer boundaries), there is one more contact to match line 914 than to match line 912 in each row of CAM cells 820.

The section headings provided in this detailed description are for convenience of reference only, and in no way define, limit, construe or describe the scope or extent of such sections. Also, while the invention has been described with reference to specific exemplary embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) cell comprising:
   a first memory cell;
   a second memory cell; and
   a compare circuit, the compare circuit including:
   a first diffusion region,
   first and second transistors formed adjacent one another in the first diffusion region and each coupled to the first memory cell, and
   third and fourth transistors formed adjacent one another in the first diffusion region and each coupled to the second memory cell.

2. The CAM cell of claim 1 wherein the first and second transistors are formed by a first polysilicon feature extending from the first memory cell to the first diffusion region.

3. The CAM cell of claim 1 further comprising a reference contact disposed on the first diffusion region between the first and second transistors.

4. The CAM cell of claim 1 further comparing a first match line contact disposed on the diffusion region between the second transistor and the third transistor, and second and third match line contacts disposed on the diffusion region at opposite ends of the CAM cell, the first match line contact being coupled to a first match line, and the second and third match line contacts being coupled to a second match line.

5. A content addressable memory (CAM) cell comprising:
   a first memory cell;
   a second memory cell;
   a first diffusion region;
   a first compare circuit coupled to a first match line and having a first transistor formed in the first diffusion region and coupled to the first memory cell, and a second transistor formed in the first diffusion region and coupled to the second memory cell; and
   a second compare circuit coupled to a second match line and having a first transistor formed in the first diffusion region and coupled to the first memory cell and a second transistor formed in the first diffusion region and coupled to the second memory cell.

6. The CAM cell of claim 5 wherein channels of the first and second transistors of the first compare circuit are formed by respective portions of the first diffusion region.

7. The CAM cell of claim 5 further comprising a first continuous feature that extends over a first area of the first diffusion region and a second area of the first diffusion region to form the first and second transistors, respectively, of the first compare circuit.

8. The CAM cell of claim 7 wherein the first continuous feature is a polysilicon feature.

9. The CAM cell of claim 7 further comprising a second continuous feature that extends over a third area of the first diffusion region and a fourth area of the first diffusion region to form the first and second transistors, respectively, of the second compare circuit.

10. The CAM cell of claim 5 wherein the first memory cell comprises a second diffusion region, and wherein the first continuous feature further extends over the second diffusion region.

11. A content addressable memory (CAM) cell comprising:

a first memory cell;

a second memory cell;

a first compare circuit coupled to a first match line and having a first transistor coupled to the first memory cell and a second transistor coupled to the second memory cell;

a second compare circuit coupled to a second match line and having a first transistor coupled to the first memory cell and a second transistor coupled to the second memory cell;

a first layer of conductive material including a conductive structure coupled between the first transistor of the first compare circuit and the first memory cell; and a second layer of conductive material including a conductive structure coupled between the second transistor of the first compare circuit and the second memory cell.

12. The CAM cell of claim 11 further comprising an insulating layer disposed between the first and second layers of conductive material, and wherein the conductive structure disposed in the first layer of conductive material overlaps the conductive structure disposed in the second layer of conductive material.

13. The CAM cell of claim 11 wherein the first layer of conductive material is a first metal layer, and wherein the second layer of conductive material is a second metal layer.

14. The CAM cell of claim 13 wherein the conductive structure disposed in the first layer of conductive material is a metal trace formed in the first metal layer.

15. A content addressable memory (CAM) cell comprising:

a first memory cell;

a second memory cell;

a first compare circuit coupled to a first match line and having a first transistor coupled to the first memory cell and a second transistor coupled to the second memory cell;

a second compare circuit coupled to a second match line and having a first transistor coupled to the first memory cell and a second transistor coupled to the second memory cell; and a first layer of conductive material, the first transistor of the first compare circuit and the first transistor of the second compare circuit being coupled to the first memory cell through the first layer of conductive material, and the second transistor of the first compare circuit and the second transistor of the second compare circuit being coupled to the second memory cell through the first layer of conductive material.

16. The CAM cell of claim 15 wherein the first layer of conductive material comprises a layer of polysilicon.

17. The CAM cell of claim 15 wherein the first layer of conductive material comprises a layer of metal.

18. The CAM cell of claim 15 further comprising an insulating layer disposed on the first layer of conductive material and a second layer of conductive material disposed on the insulating layer.

19. A content addressable memory (CAM) cell comprising:

a first memory cell;

a second memory cell;

a diffusion region;

a first compare circuit formed at least in part on the diffusion region, the first compare circuit being coupled to a first match line and having a first transistor coupled to the first memory cell and a second transistor coupled to the second memory cell;

a second compare circuit formed at least in part on the diffusion region, the second compare circuit being coupled to a second match line and having a first transistor coupled to the first memory cell and a second transistor coupled to the second memory cell;

a first contact disposed on the diffusion region and coupled to the first match line and to a first portion of the first compare circuit; and a second contact disposed on the diffusion region and coupled to the first match line and to a second portion of the first compare circuit.

20. The CAM cell of claim 19 wherein the first portion of the first compare circuit includes the first transistor of the first compare circuit, and wherein the second portion of the first compare circuit includes the second transistor of the first compare circuit.

21. The CAM cell of claim 19 wherein the diffusion region extends between opposite boundaries of the CAM cell, and wherein the first and second contacts are disposed at the opposite boundaries of the CAM cell.

22. The CAM cell of claim 19 wherein the first contact is coupled between the first match line and the first portion of the compare circuit.

23. The CAM cell of claim 19 wherein the first and second contacts are disposed at opposite sides of the CAM cell, and wherein the CAM cell further comprises a third contact coupled to the second match line and disposed on the diffusion region substantially midway between the opposite sides.

24. A content addressable memory (CAM) cell comprising:

a diffusion feature having non-overlapping first, second and third regions, the first region being disposed between the second and third regions;

a first compare circuit disposed within the first region; and a second compare circuit having a first compare sub-circuit disposed in the second region and a second compare sub-circuit disposed in the third region.

25. The CAM cell of claim 24 further comprising first and second memory cells coupled to the first and second compare circuits.

26. The CAM cell of claim 25 wherein the first compare circuit comprises a first transistor coupled to the first memory cell and a second transistor coupled to the second memory cell.

27. The CAM cell of claim 26 wherein the first sub compare circuit comprises a first transistor coupled to the first memory cell, and wherein the second sub-compare circuit comprises a first transistor coupled to the second memory cell.

28. The CAM cell of claim 27 wherein the first compare circuit further comprises a third transistor coupled to a first compare line, and a fourth transistor coupled to a second compare line.

29. The CAM cell of claim 28 wherein the first sub-compare circuit further comprises a second transistor coupled to a third compare line, and wherein the second sub-compare circuit further comprises a second transistor coupled to a fourth compare line.

30. The CAM cell of claim 25 wherein the first compare circuit is coupled to the first memory cell and to the second memory cell, the first compare sub-circuit is coupled to the first memory cell, and the second sub-compare circuit is coupled to the second memory cell.

31. The CAM cell of claim 30 wherein the first compare circuit is coupled to first and second compare lines, the first sub-compare circuit is coupled to a third compare line, and the second sub-compare circuit is coupled to a fourth compare line.

32. The CAM cell of claim 30 wherein the first compare circuit is coupled to first and second compare lines to receive a first complementary pair of comparand signals, and wherein the first and second sub-compare circuits are coupled to third and fourth compare lines, respectively, to receive a second complementary pair of comparand signals within the second compare circuit.

33. A content addressable memory (CAM) device comprising:

a row of N CAM cells including a diffusion region that extends across each of the N CAM cells, N first contacts disposed on the diffusion region, and N+1 second contacts disposed on the diffusion region;

a first match line coupled to each of the N first contacts; and a second match line coupled to each of the N+1 second contacts.

34. The CAM device of claim 33 wherein each of the N first contacts is disposed between opposing boundaries of a respective one of the N CAM cells.

35. The CAM device of claim 33 wherein the row of N CAM cells comprises N+1 boundaries including a pair of boundaries at opposite ends of the row, and N−1 boundaries between the N CAM cells, and wherein the N+1 second contacts are disposed respectively at the N+1 boundaries.

36. The CAM device of claim 35 wherein each of the N contacts is disposed between a respective pair of the N+1 contacts.

* * * * *